(12) United States Patent  
Akiyama et al.

(10) Patent No.: US 7,457,680 B2  
(45) Date of Patent: Nov. 25, 2008

(54) CONVEYANCE METHOD FOR TRANSPORTING OBJECTS

(75) Inventors: Shuji Akiyama, Nirasakai (JP); Toshihiko Iijima, Nirasakai (JP); Hiroki Hosaka, Nirasakai (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/550,433

(22) Filed: Oct. 18, 2006

(65) Prior Publication Data

US 2007/0150085 A1 Jun. 28, 2007

Related U.S. Application Data

(63) Continuation-in-part of application No. 11/129,313, filed on May 16, 2005, now abandoned, which is a continuation of application No. 10/465,915, filed on Jun. 27, 2003, now abandoned.

(30) Foreign Application Priority Data

| Dec. 27, 2000 | (JP) | ............................. 2000-399183 |
| Dec. 28, 2000 | (JP) | ............................. 2000-402325 |
| Jan. 12, 2001 | (JP) | ............................. 2001-005789 |
| Jan. 12, 2001 | (JP) | ............................. 2001-005790 |
| Jan. 12, 2001 | (JP) | ............................. 2001-005791 |

(51) Int. Cl.
G06F 19/00 (2006.01)
G06F 7/00 (2006.01)
G05B 19/18 (2006.01)

(52) U.S. Cl. .................. 700/112; 700/60; 700/100; 700/121; 700/218; 700/228; 414/935

(58) Field of Classification Search ......... 700/100–102, 700/112–116, 121, 60, 213, 218, 228; 414/217, 414/222.01, 222.12, 225.01, 935, 936, 939, 414/941

See application file for complete search history.

(56) References Cited

U.S. PATENT DOCUMENTS

| 3,845,286 | A | * | 10/1974 | Aronstein et al. ............ 700/102 |
| 4,062,463 | A | * | 12/1977 | Hillman et al. ................ 15/77 |
| 4,789,294 | A | * | 12/1988 | Sato et al. .............. 414/416.03 |

(Continued)

FOREIGN PATENT DOCUMENTS

| EP | 0 322 205 | 6/1989 |
| EP | 0 359 525 | 3/1990 |
| EP | 0 603 396 | 6/1994 |
| GB | 2 351 161 | 12/2000 |

(Continued)

OTHER PUBLICATIONS

International Preliminary Examination Report (PCT/IPEA/409) (translated) issued for PCT/JP01/11571.
Notification of Transmittal of Copies of Translation of the International Preliminary Examination Report (PCT/IB/338) issued for PCT/JP01/11571.

*Primary Examiner*—Sean P Shechtman  
(74) *Attorney, Agent, or Firm*—Smith, Gambrell & Russell, LLP

(57) ABSTRACT

The present invention relates to conveyance method for transporting a plurality of unprocessed/processed objects between an automatic transporting device (AGV) and a semiconductor manufacturing device (prober). The prober has a load port to/from which the objects are delivered from/to the AGV. The method comprises the steps of: making a communication between the AGV and the prober to decide respective timings of deliveries of the objects to/from the load port; and transporting the objects between the AGV and the prober via the load port, with the timings of the deliveries of the objects to/from the load port shifted from each other by using a holding site for provisionally holding the object. The holding site is at least one of components of the AGV and the prober other than the load port.

4 Claims, 20 Drawing Sheets

U.S. PATENT DOCUMENTS

| | | | |
|---|---|---|---|
| 5,436,848 A * | 7/1995 | Nishida et al. | 700/112 |
| 5,614,837 A | 3/1997 | Itoyama et al. | |
| 5,617,338 A | 4/1997 | Sugano et al. | |
| 5,742,173 A | 4/1998 | Nakagomi et al. | |
| 5,814,733 A * | 9/1998 | Khoury et al. | 73/658 |
| 5,968,282 A * | 10/1999 | Yamasaka | 134/6 |
| 6,019,663 A * | 2/2000 | Angell et al. | 451/5 |
| 6,124,725 A | 9/2000 | Sato | |
| 6,175,777 B1 | 1/2001 | Kim | |
| 6,516,238 B1 | 2/2003 | Kim et al. | |

FOREIGN PATENT DOCUMENTS

| | | |
|---|---|---|
| JP | 3-289152 | 12/1991 |
| JP | 5-069997 | 3/1993 |
| JP | 5-069998 | 3/1993 |
| JP | 6-097262 | 4/1994 |
| JP | 6-120316 | 4/1994 |
| JP | 7-078860 | 3/1995 |
| JP | 7-297256 | 11/1995 |
| JP | 8-264619 | 10/1996 |
| JP | 10-303270 | 11/1998 |

* cited by examiner

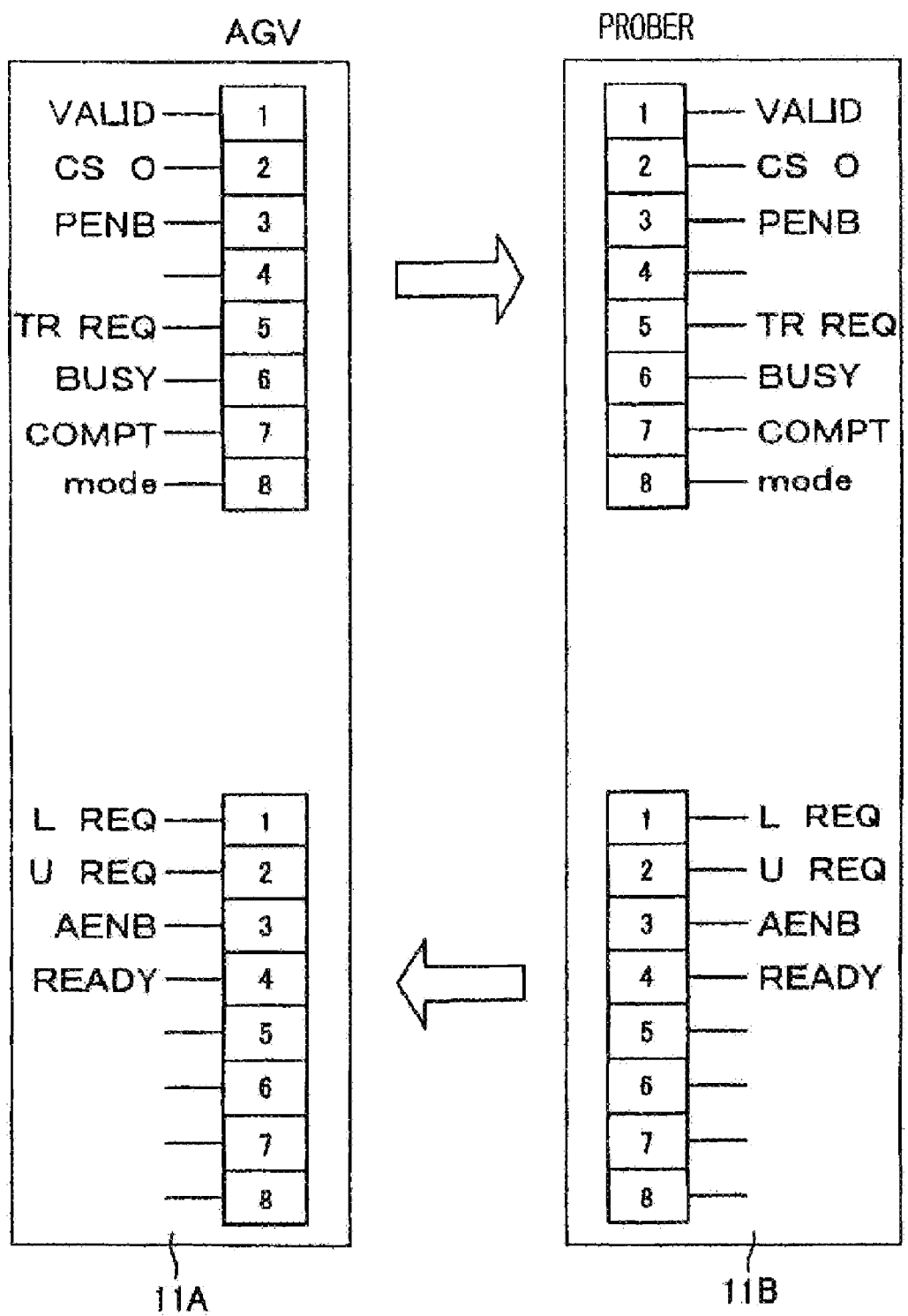
F I G. 7

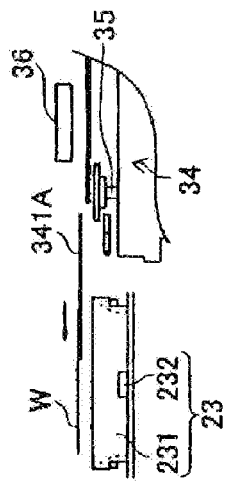
FIG. IIA
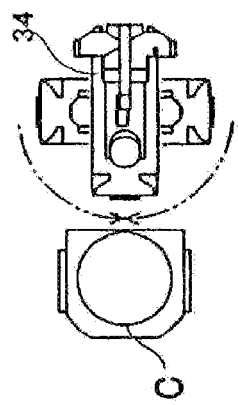
FIG. IIB
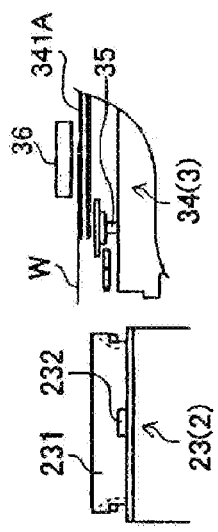
FIG. IIC
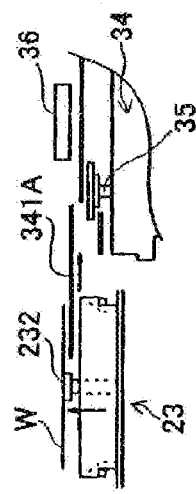
FIG. IID
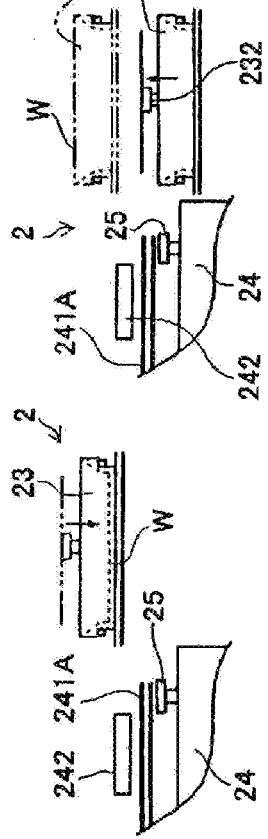
FIG. IIE
FIG. IIF
FIG. IIG

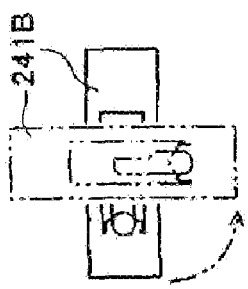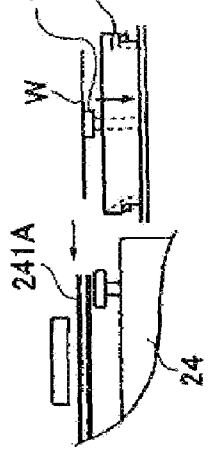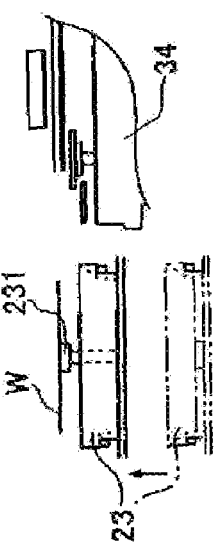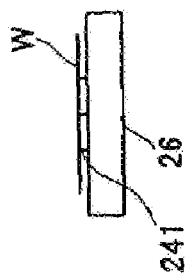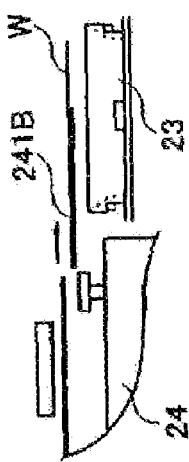

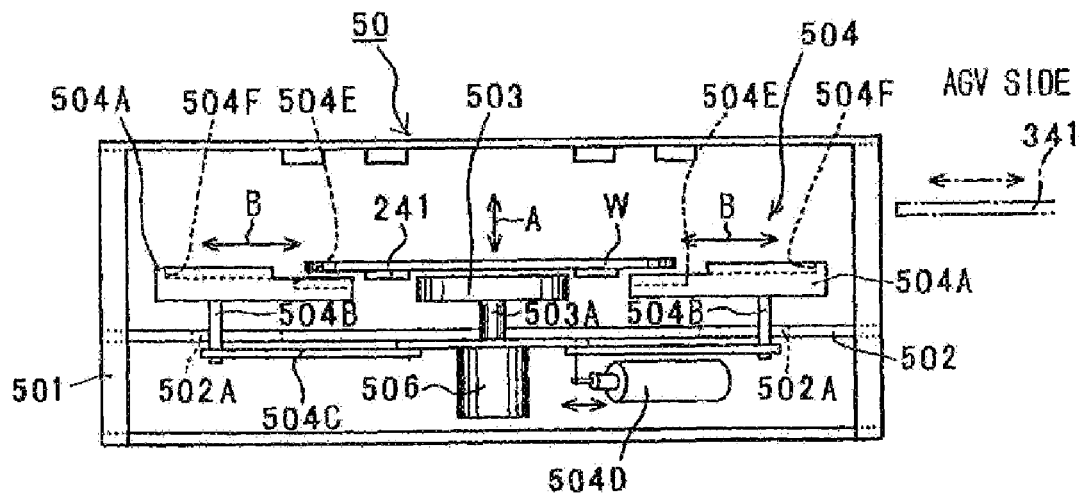
F I G. 17A
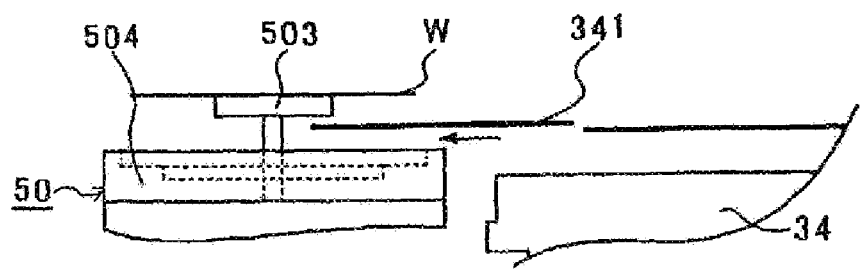
F I G. 17B

CONVEYANCE METHOD FOR TRANSPORTING OBJECTS

CROSS-REFERENCE TO RELATED APPLICATIONS

This application is a continuation in part of application Ser. No. 11/129,313, filed May 16, 2005 now abandoned, which is a continuation of application Ser. No. 10/465,915, filed Jun. 27, 2003, now abandoned.

BACKGROUND OF THE INVENTION

1. Field of the Invention

The present invention relates to a conveyance method for transporting a plurality of unprocessed/processed objects between an automatic transporting device and a semiconductor manufacturing device, the manufacturing device having a load port to/from which the objects are delivered from/to the automatic transporting device.

2. Background Art

In the inspection process of semiconductor devices, for example, a prober is widely used as an inspecting device for inspecting semiconductor wafers (the semiconductor waters will be simply referred "wafers", after.). Normally, the prober includes a loader chamber and a prober chamber and performs to inspect the electric characteristics of a device in the form of a wafer. The loader chamber includes a carrier mount for mounting a carrier accommodating a plurality of wafers (e.g. 25 sheets), a wafer transporting mechanism (which will be also referred "arm mechanism" after) for transporting the wafers from the carrier mounting part one by one and a prealignment mechanism (which will be referred "sub-chuck" after) for carrying out pre-alignment for a wafer transported by the arm mechanism. Further, the prober chamber is equipped with a mounting table (which will be referred "main-chuck" after) that moves in all directions of X, Y, Z and θ while mounting a wafer thereon, an alignment mechanism for carrying out alignment of the wafer in cooperation with the main chuck, a probe card arranged above the main chuck and a test head interposed between the probe card and a tester.

Therefore, when inspecting the wafers, an operator firstly mounts a carrier having a plurality of wafers accommodated therein in lot unit, on the carrier mount in the loader chamber. Next, with the drive of the prober, the arm mechanism picks up the wafers in the carrier, one by one. Then, after carrying out pre-alignment for the wafer by the sub-chuck, the arm mechanism delivers the wafer to the main chuck in the prober chamber. In the loader chamber, the alignment for the wafer is carried out by the main chuck and the alignment mechanism. While index-feeding the wafer by the main chuck, the wafer after the alignment is brought into electrical contact with the probe card thereby to perform to inspect the designated electrical characteristics of the wafer. After completing the inspection of the wafer, the arm mechanism in the loader chamber receives the wafer on the main chuck and returns it to the original position. Thereafter, the operator repeats the above procedure in order to inspect the next wafer. On completion of inspecting all the wafers in the carrier, the operator exchanges the carrier for the next carrier and further repeats the above inspection for new wafers.

However, if a wafer to be inspected has a large diameter of, for example, 300 mm, it becomes almost impossible for an operator to handle a carrier having a plurality of such wafers because the carrier is remarkably heavy. Even if the operator can handle the carrier, the operator's carrying alone may be accompanied with a risk. Further, since the management about particles in a clean room has become severe with the hyperfineness of semiconductor devices, the automatization of manufacturing installations, such as carrier conveyer, is taking on importance increasingly in view of managing particles in the clean room. This requirement applies to not only a prober but also general semiconductor devices.

Additionally, due to the large-diameter and hyperfineness of a wafer, there is a jump in the number of devices to be formed in a single wafer, requiring a long period for completing a process, such as inspection, for one wafer Moreover, to process wafers in lot unit would cause the wafers after processing to stay in a prober until the processing operation will be completed in all of the wafers in the lot, thereby delaying a time for feeding the wafers in lot unit to a sequent process. Consequently, it becomes difficult to shorten TAT (Turn-Around-Time) in the production.

Therefore, it is desired to provide conveyance system and method for transporting objects to be processed, which enable automatization of the conveyance operation about the objects thereby to realize a reduction in the number of operators and which can shorten TAT about the objects.

On the other hand, since there is a recent tendency that the carrier becomes heavy for the wafers having large diameters thereby making it difficult and risky for an operator to handle such a carrier, Japanese Patent Publication (kokai) No. 10-303270 proposes a conveyance method that employs an automated guided vehicle (which will be also referred as "AGV" after) to transport the carrier thereby to allow wafers in the same lot to be delivered between the vehicle and an process installation, in carrier unit. With the adoption of this conveyance method, an operator's transporting a carrier is so automated that the above problem can be solved. In this method, when transporting wafers from an automatic transporting device to a process installation, such as semiconductor manufacturing device, it is carried out to make the carrier-destination "load port" number of a signal line of the communication interface accord with the "load port" number of the semiconductor manufacturing device thereby transporting objects to be processed, such as wafers, to a designated carrier mount, in carrier unit.

However, if one carrier is present in the semiconductor manufacturing device having the only load port, the next carrier cannot be loaded unless the previous carrier is unloaded from the semiconductor device as a result of completion of processing all the objects in this carrier. Thus, the operation for processing the objects comes to a standstill during loading and unloading the carrier, so that an improvement in the throughput of the system cannot be expected. While, if establishing new load ports in the semiconductor device, then a problem arises in the increase in footprint and also manufacturing cost There is the same problem when transporting a plurality of unprocessed/processed objects (wafers) between the AGV and the semiconductor manufacturing device via the load port.

Therefore, it is desired to provide a conveyance method for efficiently transporting a plurality of unprocessed/processed objects between the AGV and the semiconductor manufacturing device via the load port, without requiring an excessive space for an additional load port, thereby preventing the footprint and the system manufacturing cost from increasing. Additionally, it is desired to provide a centering device that can center an object to be processed certainly when transferring objects to be processed, one by one.

Further, due to the large-diameter and hyperfineness of a wafer, there is a jump in the number of devices to be formed in a single wafer, requiring a long period for completing various processing, such as inspection, for one single wafer.

Therefore, even if the wafers in the same lot could be transported to a semiconductor manufacturing device, such as inspecting device in carrier unit by the AGV, the processing of wafers in lot unit would require considerable date and time while causing even the wafers after processing to stay in the semiconductor manufacturing device. Consequently, the time to feed the wafers in lot unit to a sequent process is delayed to that extent, so that it becomes difficult to shorten TAT (Turn-Around-Time) in the production.

Therefore, it is desired to provide conveyance system and method for transporting objects to be processed, which enable certain delivery of the objects to be processed, such as wafers, in sheet unit between an automatic transporting device and a plurality of semiconductor manufacturing devices and which enables parallel processing of the objects by the plural semiconductor manufacturing devices thereby realizing the abbreviation of TAT about the objects.

Further, as for the conventional centering method, the centering has been carried out by using an optical sensor, after picking up a wafer from a carrier through an arm mechanism and before executing the pre-alignment of the wafer. Therefore, there are problems that it takes a lot of time for centering a wafer and a lot of cost for the optical sensor for this centering.

Therefore, it is desired to provide a centering method for wafers, which eliminates a process exclusive to the centering operation and the optical sensor for centering thereby enabling contribution to an improvement in the throughput and a reduction in the device cost.

As mentioned above, Japanese Patent Publication (kokai) No. 10-303270 proposes a method for transferring a carrier-in lot unit by using the AGV With the adoption of this conveyance method, it is possible to solve the above problem about the transportation of wafers.

However, due to the large-diameter and hyperfineness of a wafer, there is a jump in the number of devices to be formed in a single wafer, requiring a long period for completing an inspection of one wafer. Moreover, the inspection of wafers in lot unit would cause the wafers after inspecting to stay in a prober (carrier) until the inspection of all of the wafers in the lot is completed thereby delaying a time for feeding the wafers in lot unit to a sequent process. Consequently, it becomes difficult to shorten TAT (Turn-Around-Time) in the production.

Therefore, by executing the following steps of: dividing the wafers one by one into a plurality of probers thereby processing the wafers at the probers in parallel; subsequently picking up the wafers after inspecting from the probers in sequence and further accommodating them in lot unit into a carrier and furthermore, and transferring the so-accommodated wafers in carrier unit to the next process, it becomes possible to shorten the TAT Then, in view of delivering wafers one by one, the AGV has to be equipped with a pincette. However, in order to allow an arm mechanism to hold the wafers one by one on the arm, it is noted that the arm mechanism requires a vacuum absorbing mechanism. For this vacuum absorbing mechanism, it is preferable in simplicity for the mechanism to employ a compressor and an ejector. However, since there exists a limitation in the power capacity of a battery forming a drive source for the compressor, on board of the AGV, it is impossible to assure a sufficient flow rate of exhaust gas necessary for the vacuum absorption.

Therefore, it is desired to provide a vacuum holding device for objects to be processed, which can assure a sufficient flow rate of exhaust gas in spite of a low-capacity battery on board of a moving body, thereby allowing the object to be absorbed in vacuum certainly.

DISCLOSURE OF THE INVENTION

In particular, it is an object of the present invention to provide a conveyance method for efficiently transporting a plurality of unprocessed/processed objects between an automatic transporting device and a semiconductor manufacturing device via a load port, without requiring an excessive space for an additional load port.

In order to achieve the object, the present invention provides a conveyance method for transporting a plurality of unprocessed/processed objects between an automatic transporting device and a semiconductor manufacturing device, the manufacturing device having a load port to/from which the objects are delivered from/to the automatic transporting device, a processing vessel, and a transporting mechanism for transferring the objects between the load port and the processing vessel, said method comprising the steps of:

making a communication between the automatic transporting device and the manufacturing device to decide respective timings of deliveries of the objects to/from the load port; and transporting the objects between the automatic transporting device and the manufacturing device via the load port, with the timings of the deliveries of the objects to/from the load port shifted from each other by using at least one of components of the automatic transporting device and the manufacturing device for provisionally holding the object, the at least one of components being selected from the group consisting of:

(a) at least one of a plurality of transfer arms provided in the automatic transporting device;

(b) at least one of a plurality of transfer arms provided in the transporting mechanism;

(c) a sub-chuck configured to carry out a pre-alignment of the object in the manufacturing device;

(d) a grinder-wafer table configured to place thereon a grinder wafer used for grinding a probe card provided in the processing vessel; and (e) an unloading table arranged below the load port to provisionally place thereon the object, the unloading table and the load port being configured to move integrally in a vertical direction An optical communication may be employed as the communication between the automatic transporting device and the manufacturing device. The semiconductor manufacturing device may be an inspecting device configured to inspect the object by using the probe card.

The present invention also provides a storage medium for storing a program configured to execute said conveyance method.

Other features that the present invention may provide are as follows.

The first feature of the present invention resides in comprising: a host computer for managing production of semiconductor devices; a plurality of semiconductor manufacturing devices for manufacturing semiconductor devices from the objects to be processed under the host computer's administration; an automatic transporting device for automatically transporting the objects in order to deliver the objects one by one to the semiconductor manufacturing devices according to respective demands; and a transport control device for controlling the operation of the automatic transporting device under the host computer's administration.

The 2nd. feature of the present invention resides in that the semiconductor manufacturing devices are inspecting devices each carrying out inspection for the electric characteristics of the objects.

The 3rd. feature of the present invention resides in that the inspecting devices each have first delivery mechanisms for delivering the objects one by one and the automatic transporting device includes a mounting part for mounting the objects in carrier unit and a second delivery mechanism for delivering the objects one by one between the mounting part and the inspecting devices.

The 4th. feature of the present invention resides in that the inspecting devices and the automatic transporting device have respective optical communicating means for carrying out mutual optical communication between the inspecting devices and the automatic transporting device, whereby the objects are delivered therebetween through the optical communicating means.

The 5th. feature of the present invention resides in that the automatic transporting device has discriminating means for discriminating the kinds of the objects.

The 6th. feature of the present invention resides in that the automatic transporting device has means for carrying out alignment of the object when delivering the object.

The 7th. feature of the present invention resides in the provision of a conveyance method for objects to be processed, comprising the steps of: transporting the objects in unit of a carrier by an automatic transporting device; transferring the objects in the carrier one by one by a delivering mechanism of the automatic transporting device; delivering the objects one by one to a semiconductor manufacturing device by the delivering mechanism.

The 8th. feature of the present invention resides in that the semiconductor manufacturing device is an inspecting device for inspecting the electric characteristics of the object.

The 9th. feature of the present invention resides in further comprising a step of carrying out alignment of the object by the delivering mechanism and the carrier.

The 10th. feature of the present invention resides in that the object is transferred by making use of an optical communication.

The 11th. feature of the present invention resides in the provision of a conveyance method for transporting objects to be processed to a so semiconductor manufacturing device from an outside thereof comprising the steps of establishing at least one imaginary load port different from an actual load port in the semiconductor manufacturing device by using a communication medium; and thereafter, allowing the objects to be loaded to a plurality of positions in the semiconductor manufacturing device.

The 12th. feature of the present invention resides in the provision of a conveyance method for transporting objects to be processed to a semiconductor manufacturing device from an outside thereof comprising the steps of: establishing at least one imaginary load port different from an actual load port in the semiconductor manufacturing device by using a communication medium; next selecting a storage site different from the actual load port and storing the object in the storage site; and thereafter, transferring the object brought from the outside to the actual load port.

The 13th. feature of the present invention resides in that the objects are transferred from an automatic transporting device to the semiconductor manufacturing device.

The 14th. feature of the present invention resides in that the storage site is provided in the semiconductor manufacturing device and a transporting mechanism having two-stage upper and lower arms is employed.

The 15th. feature of the present invention resides in that the semiconductor manufacturing device has one actual load port.

The 16th. feature of the present invention resides in that the semiconductor manufacturing device is an inspecting device.

The 17th. feature of the present invention resides in that an optical communication is employed as the communication medium.

The 18th. feature of the present invention resides in that the objects are transferred one by one.

The 19th. feature of the present invention resides in the provision of a semiconductor manufacturing device having a mount table for mounting objects to be processed and carrying out a designated process for the objects mounted on the mounting table, the semiconductor manufacturing device comprising, at least: a load port for once holding the objects and loading-and-unloading the objects; a plurality of arms for transferring the object between the load port and the mount table; and control means for controlling the arms when loading the objects from the outside so that any one of the arms is established as an imaginary port and that the object is held by the one of the arms and can be loaded into the load port.

The 20th. feature of the present invention resides in further comprising communicating means which is used when transferring the objects between an automated guided vehicle and the load port.

The 21st. feature of the present invention resides in that the objects are transferred one by one.

The 22nd. feature of the present invention resides in that the load port is equipped with a centering mechanism.

The 23rd feature of the present invention resides in that the load port includes means for holding plural kinds of processed objects having different diameters.

The 24th. feature of the present invention resides in the provision of a centering device which receives objects to be processed, one by one and centers each of the objects, the centering device comprising: a support body capable of moving up and down to transfer the object; and a centering mechanism for centering the object brought from the support body, wherein the centering mechanism includes a pair of centering plates arranged ion both sides of the support body and having respective bearing parts formed with engagement surfaces in conformity with an outer circumferential surface of the object and a driving mechanism for expanding and contracting these centering plates.

The 25th. feature of the present invention resides in that the centering plates each have a plurality of engagement surfaces of different diameters, on multiple-stage.

The 26th. feature of the present invention resides in that the driving device includes a link mechanism connected with respective shaft suspended from the respective centering plates and a cylinder mechanism connected with the link mechanism.

The 27th feature of the present invention resides in that the object is transferred between the centering device and an automatic transporting device.

The 28th. feature of the present invention resides in the provision of a conveyance system for objects to be processed, comprising: a plurality of semiconductor manufacturing devices for applying a designated process to the objects; an automatic transporting device for automatically transporting the objects in carrier unit in order to deliver the objects one by one to the semiconductor manufacturing devices according to respective demands; and a first delivery mechanism arranged in each of the semiconductor manufacturing devices to transfer the objects one by one, to and from the automatic transporting device; a second delivery mechanism arranged in toe automatic transporting device to transport the objects one by one, to and from the semiconductor manufacturing devices; a control device for controlling the first delivery mechanism and the second delivery mechanism; and an optically coupled parallel I/O communication interface for transmitting and receiving a control signal of the control device, in the form of an optical signal The 29th feature of the present invention resides in that the first delivery mechanism includes a holding body that supports the object and can move up and down and a first vacuum absorbing mechanism that absorbs the object in vacuum on the holding body and the second delivery mechanism includes an arm that transfers the objects one by one and a second vacuum absorbing mechanism that absorbs the object in vacuum on the arm.

The 30th. feature of the present invention resides in that the optically coupled parallel I/O communication interface includes a signal port that transmits and receives optical signals for controlling the first vacuum absorbing mechanism and the second vacuum absorbing mechanism.

The 31st feature of the present invention resides in the provision of a method for transferring objects to be processed, one by one, between a first delivery mechanism of a semiconductor manufacturing device and a second delivery mechanism of an automatic transporting device by an optical communication through an optically coupled parallel I/O communication interface, the method comprising the steps of allowing the first delivery mechanism and the second delivery mechanism to prepare for delivery of the object; allowing the second delivery mechanism to have access to the first delivery mechanism for the delivery of the object; transferring the object between the first delivery mechanism and the second delivery mechanism; and allowing the second delivery mechanism to withdraw from the first delivery mechanism thereby completing the delivery of the object.

The 32nd. feature of the present invention resides in the provision of a method for transferring objects to be processed, one by one, between a first delivery mechanism of a semiconductor manufacturing device and a second delivery mechanism of an automatic transporting device by an optical communication through an optically coupled parallel I/O communication interface, the method comprising the steps of: when starting delivery of the object between the first delivery mechanism and the second delivery mechanism, informing the start of the delivery of the object from the automatic transporting device to the semiconductor manufacturing device; when confirming the possibility of the second delivery mechanism to have access to the first delivery mechanism on a basis of the existence of the object in the first delivery mechanism, informing the possibility of the second delivery mechanism from the semiconductor manufacturing device to the automatic transporting device; when carrying out transfer-and-delivery of the object between the first delivery mechanism and the second delivery mechanism, informing an execution of the transfer-and-delivery of the object from the semiconductor manufacturing device to the automatic transporting device; when confirming the possibility of the second delivery mechanism to withdraw from the first delivery mechanism on a basis of the existence of the object in the second delivery mechanism, informing the possibility of the second delivery mechanism from the semiconductor manufacturing device to the automatic transporting device; and when confirming completion of the transfer-and delivery of the object as a result of the second delivery mechanism's withdrawal from the first delivery mechanism, informing the completion of transfer-and-delivery of the object from the automatic transporting device to the semiconductor manufacturing device.

The 33rd. feature of the present invention resides in that the confirmation of the existence of the object is carried out by a vacuum absorbing mechanism in the first delivery mechanism.

The 34th feature of the present invention resides in that the confirmation of the completion of the delivery of the object is carried out by a vacuum absorbing mechanism in the second delivery mechanism.

The 35th. feature of the present invention resides in the provision of a wafer centering method for carrying out centering when picking up a plurality of semiconductor wafers supported in a carrier horizontally, the wafer centering method comprising the steps of, inserting a transfer arm into the carrier; making the semiconductor wafers in contact with the transfer arm; making the semiconductor wafers in contact with symmetrical slanted surfaces formed at the interior of the carrier while further inserting the arm into the carrier; and fixing the semiconductor wafer onto the arm.

The 36th. feature of the present invention resides in that the centering is carried out by using the carrier mounted on an automated guided vehicle.

The 37th. feature of the present invention resides in that the centering is carried out by using the carrier mounted on a semiconductor manufacturing device.

The 38th. feature of the present invention resides in that the semiconductor wafer is fixed on the arm in vacuum absorption.

The 39th. feature of the present invention resides in the provision of a vacuum holding device for an object to be processed, having an arm for absorbing the object in vacuum, an exhaust passage formed in the arm to open at an arm's surface for absorption and a vacuum absorbing mechanism connected with the exhaust passage through a communication pipe, the vacuum holding device being usable on a moving body and comprising: a compressor driven by a battery on board; a container for storing gas, which has been fed under pressure from the compressor, as compressed gas; gas-pressure control means for controlling a pressure of the compressed gas flowing out of the container; and means for allowing the compressed gas supplied from the gas-pressure control means to spout out thereby depressurizing the interior of the exhaust passage.

The 40th. feature of the present invention resides in that the moving body is an automated guided vehicle.

The 41st. feature of the present invention resides in that the arm is a plurality of arms.

The 42nd. feature of the present invention resides in further comprising a first closing valve arranged between the gas-pressure control means and the ejecting means for allowing the compressed gas supplied from the gas-pressure control means, for opening and closing the communication pipe.

The 43rd. feature of the present invention resides in further comprising a second closing valve arranged between the arm and the ejecting means for allowing the compressed gas supplied from the gas-pressure control means, for opening and closing the communication pipe.

The 44th. feature of the present invention resides in further comprising pressure detecting means for detecting a pressure of the exhaust passage, which is arranged between the arm and the second dosing valve The 45th. feature of the present invention resides in that the pressure detecting means includes a first pressure detecting means for detecting the presence of the object on the arm and a second pressure detecting means for detecting a pressure leakage in the exhaust passage and the second closing valve opens and closes on a basis of a detecting result of the second pressure detecting means.

The 46th. feature of the present invention resides in further comprising a third pressure detecting means arranged between the gas-pressure control means and the ejecting means to detect a pressure in the communication pipe, wherein the compressor is driven on a basis of a detecting result by the third pressure detecting means.

BRIEF DESCRIPTION OF THE DRAWINGS

FIG. 7 is a constitutive view showing a PIO communication interface used for a PIO communication of the conveyance system shown in FIGS. 1A and 1B.

FIGS. 11A, 11B, 11C, 11D, 11E, 11F and 11G are process diagrams showing the loading process corresponding to the flow chart of FIG. 8.

FIGS. 13A, 13B, 13C, 13D, 13E and 13F are process diagrams showing the loading process corresponding to the flow chart of FIG. 8.

FIGS. 17A is a plan view showing one embodiment of a centering device of the present invention and FIG. 17B is a side view showing the essential part of a device action to receive a wafer from the AGV.

DESCRIPTION OF THE PREFERRED EMBODIMENTS

Based on embodiments shown in FIGS. 1A to 17B, the present invention will be described below.

Figures 1A, 1B:
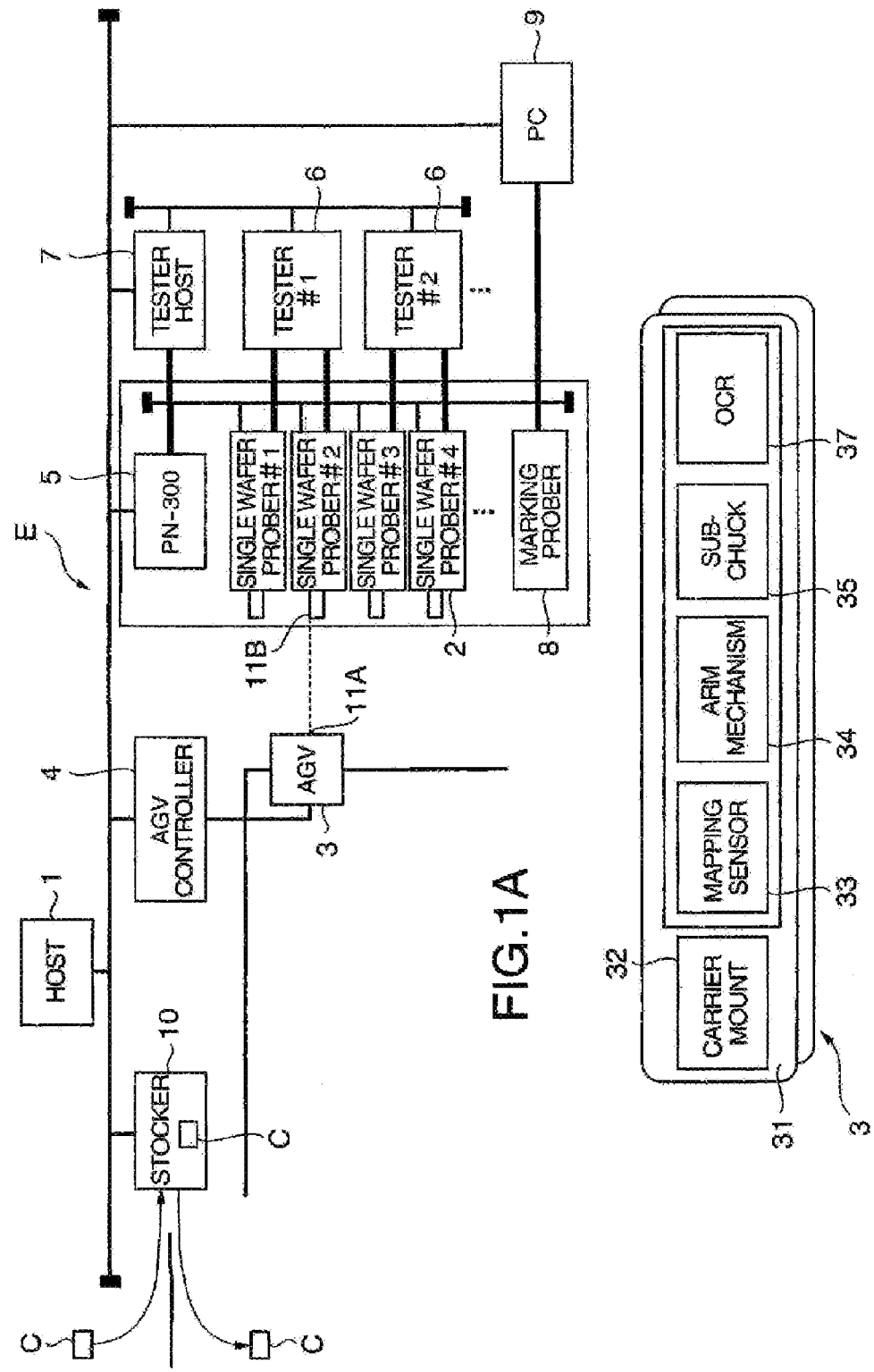
FIG. 1A is a conceptual view showing one example of a conveyance system for objects to be processed, which is used for the present invention
FIG. 1B is a conceptual view showing the constitution of an AGV.

First of all, we now describe a conveyance system for objects to be processed, which is employed in a conveyance method for the objects to be processed in accordance with the present invention. As shown in FIGS. 1A and 1B, the conveyance system (Automated material handling system (AMHS)) E includes a host computer for carrying out the product management of the whole factory including an inspection process for wafers (not shown) as the objects to be processed, a plurality of semiconductor manufacturing devices, for example, inspecting devices (e.g. probers) 2 for inspecting the electrical characteristics of the wafers under the administration of the host computer 1, a plurality of sheet-type automatic transporting devices (which will be called as "AGVs" after) 3 for automatically transporting the wafers one by one to these probers 2 according to respective demands and a transport control device (which will be called as "AGV controllers" after) 4 for controlling the operations of the automatic transporting devices 3 The probers 2 and the AGVs 3 have optically coupled parallel I/O (which will be referred as "PIO" after) communication interfaces in accordance with the SEMI standard E23 and E84. By carrying out the PIO communication between the probers 2 and the AGVs 3, the wafers E are transferred one by one therebetween. Each prober 2 is formed as a single wafer type prober 2 since it receives the wafers W one by one for its inspection. Hereinafter, the single wafer type prober 2 will be referred as "the prober 2" simply. Further the AGV controller 4 is connected to the host computer 1 through a SECS (Semiconductor Equipment Communication Standard) communication line. The controller 4 controls the AGVs 3 under the administration of the host computer 1 through radio communication and also manages the wafers W in lot unit.

As shown in FIG. 1A, the plural probers 2 are connected to the host computer 1 through a group controller 5 via the SECS communication line. The host computer 1 manages the plural probers 2 through the group controller 5. The group controller 5 manages the information about the detection of recipe data and log data in the probers 2. The probers 2 are respectively connected with tasters 6 via the SECS communication line. The probers 2 carry out designated inspections in accordance with the commands from the testers 6, individually. These testers 6 are connected with the host computer 1 through a tester host computer (which will be referred as "tester host" after) 7 via the SECS communication line. The host computer 1 manages the plural testers 6 through the tester host 7. Further, a marking device 8 carrying out a designated marking based on the inspection result of the wafer is connected with the host computer 1 through a marking indicating device 9. The marking indicating device 9 indicates a marking to the marking device 8 on the ground of data in the tester host 7. A stocker 10 stocking a plurality of carriers C is connected to the host computer 1 through SECS communication line. Under the administration of the host computer 1, the stocker 10 stocks and classifies the wafers before and after inspection in carrier unit and further transfers the wafers in carrier unit.

Figure 2A:
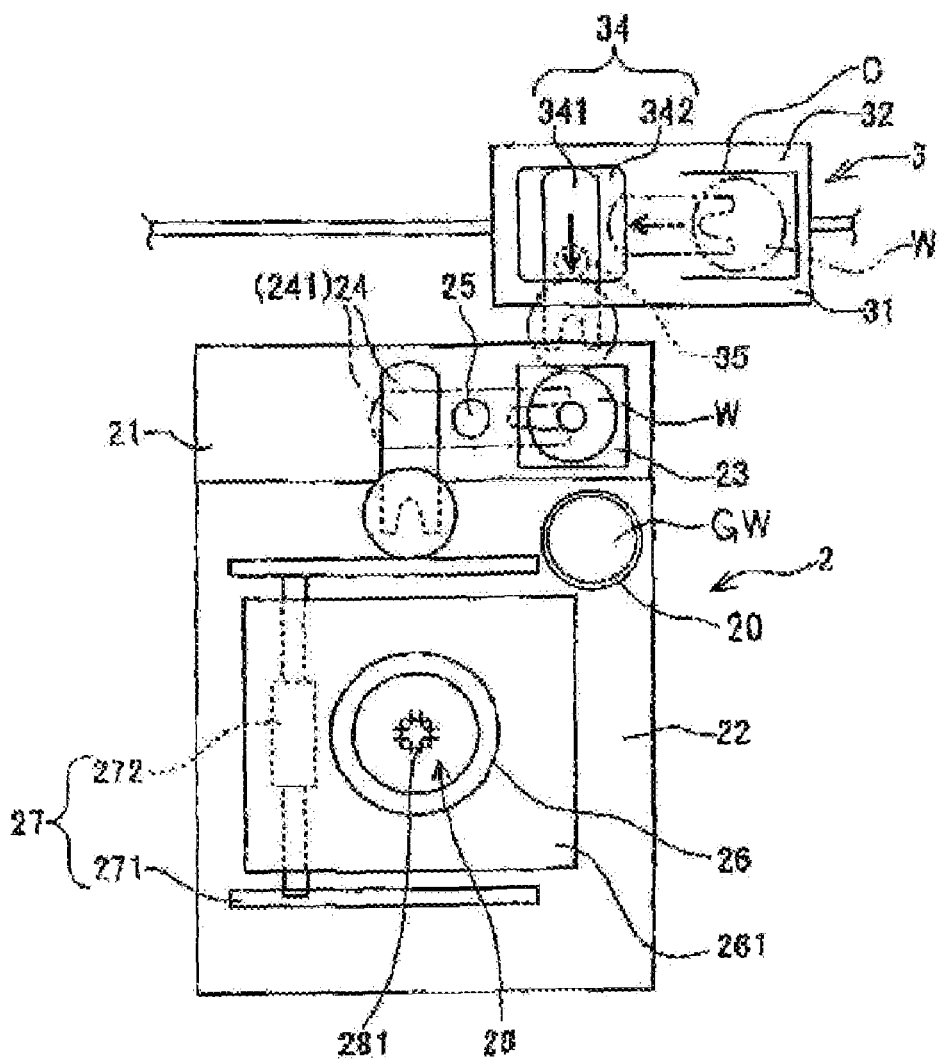
FIG. 2A is a plan view conceptually showing a state to transfer a wafer between a prober and the AGV and FIG. 2B is a side view showing the essential part of FIG. 2A.

As shown in FIG. 2A, each prober 2 includes a loader chamber 21, a prober chamber 22 and a control unit (not shown). Thus, the prober 2 is constructed so as to control the drives of respective instruments in the loader chamber 21 and the prober chamber 22 Including an adapter 23, an arm mechanism (transporting mechanism) 24, a sub-chuck 25, and a grinder-wafer table 20, the loader 21 has a structure similar to that of the conventional prober, except the adapter 23. The adapter 23 is formed as a first delivery mechanism that transfers the wafers W one by one to and from the AGV 3. The details of the adapter 23 will be described later. The arm mechanism 24 has two-stage upper and lower arms (transfer arms) 241. Through the respective arms 241, the mechanism 24 holds the wafers W in vacuum absorption and delivers the wafers W between the arms 241 and the adapter 23 and transfers the wafers W to the prober chamber 22 by canceling the vacuum absorption Based on an orientation flat about the wafer W, the sub-chuck 25 carries out its pre-alignment while the wafer W is being transferred by the arm mechanism 24 The prober chamber 22 has a main chuck 26, an alignment mechanism 27 and a probe card 28. The main chuck 26 is capable of movements of X and Y directions by an X/Y table 261 and further movements of Z and θ directions by a not-shown elevating mechanism and a θ-rotating mechanism. As known in the conventional art, the alignment mechanism 27 has an alignment bridge 271, a CCD camera 272 and others and carries out the alignment operation between the wafer W and the probe card 28 in cooperation with the main chuck 26. The probe card 28 has a plurality of probes 281 for electrical contact with a wafer on the main chuck 26 and is connected to the tester 6 (see FIG. 1A) through a test head (not shown). The grinder-wafer table 20 is configured to place thereon a grinder wafer GW used for grinding (cleaning) the probe card 28 (probers 281). For example, the grinder wafer GW is provided with a grinding (cleaning) sheet including abrasives of silicon carbide on a surface thereof. It is possible to place on the grinder-wafer table 20 an unprocessed/processed wafer W in the absence of the grinder wafer GW, while the grinder wafer GW is used, e.g., for grinding the probe card 28. Note, in view that the arm mechanism 24 is provided with the two-stage upper and lower arms 241, one arm on the upper stage will be referred as "upper arm 241A", while the other arm on the lower stage is referred as "lower arm 241B" in the following descriptions.

Figure 2B:
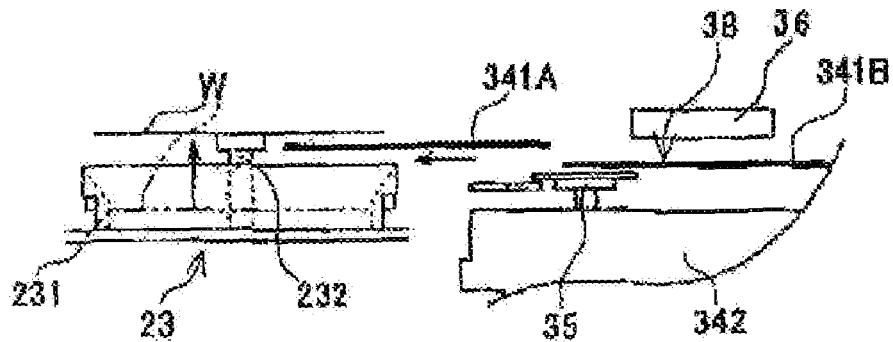

The adapter 23 is an instrument which is peculiar to this embodiment. As shown in FIG. 2B, the adapter 23 includes an adapter body 231 shaped to be a flattened cylinder and having a tapered face and a sub-chuck 232 moving up and down at the center of the bottom of the adapter body 231. When transferring the wafer W to and from the AGV 3 or the arm mechanism 24, the sub-chuck 232 moves up and down to hold the wafer W in absorption. This adapter 23 is detachably arranged on a carrier table (not shown) and is capable of moving up and down by an indexer (not shown) of the carrier table. Accordingly, when delivering the wafer W, the adapter 23 is raised by the indexer and the sub-chuck 232 rises up to a position to deliver the wafer W as shown in FIG. 2B. After receiving the wafer W, the sub-chuck 232 falls to a position shown with a chain double-dashed line of the figure while carrying out the centering for the wafer W by the adapter body 231. Further, the carrier table is constructed so as to allow a carrier to be mounted thereon. Having a judgement sensor (not shown) for judging the carrier or the adapter 23, the carrier table can be used in the same manner as the conventional prober 2.

Again, as shown in FIGS. 1B, 2A and 2B, the AGV 3 includes a unit body 31, a carrier mounting part 32 arranged on one end of the unit body 31 to mount the carrier C and capable of moving up and down, a mapping sensor 33 for detecting the position of a wafer accommodated in the carrier C, an arm mechanism 34 for transferring the wafer in the carrier Cl a sub-chuck 35 for carrying out pre-alignment for the wafer W, an optical pre-alignment sensor a6 (see FIG. 11A), an optical character reader (OCR) for reading an ID cord (not shown) of the wafer W and a battery (not shown) as a drive source. By the radio communication between the AGV controller 4 and the AGV 31 it transfers the carrier C between the stocker 10 and the probers 3 and also among the plural probers 2 and further delivers the wafers W in the carrier C to the probers 2 by the arm mechanism 34, one wafer by one wafer.

Figure 3:
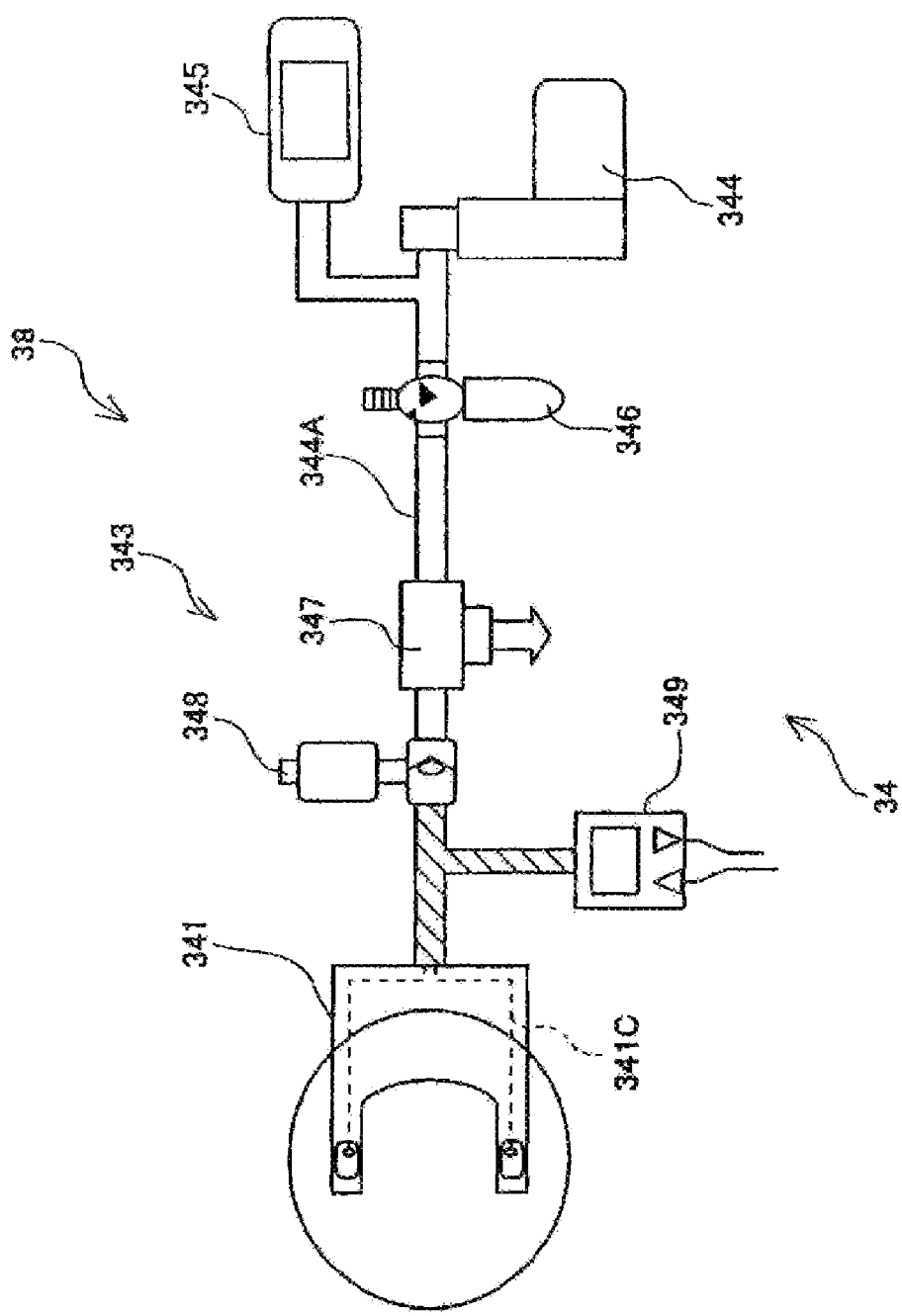
FIG. 3 is a conceptual view showing a vacuum absorbing mechanism of an arm mechanism used in the AGV.
Figure 4:
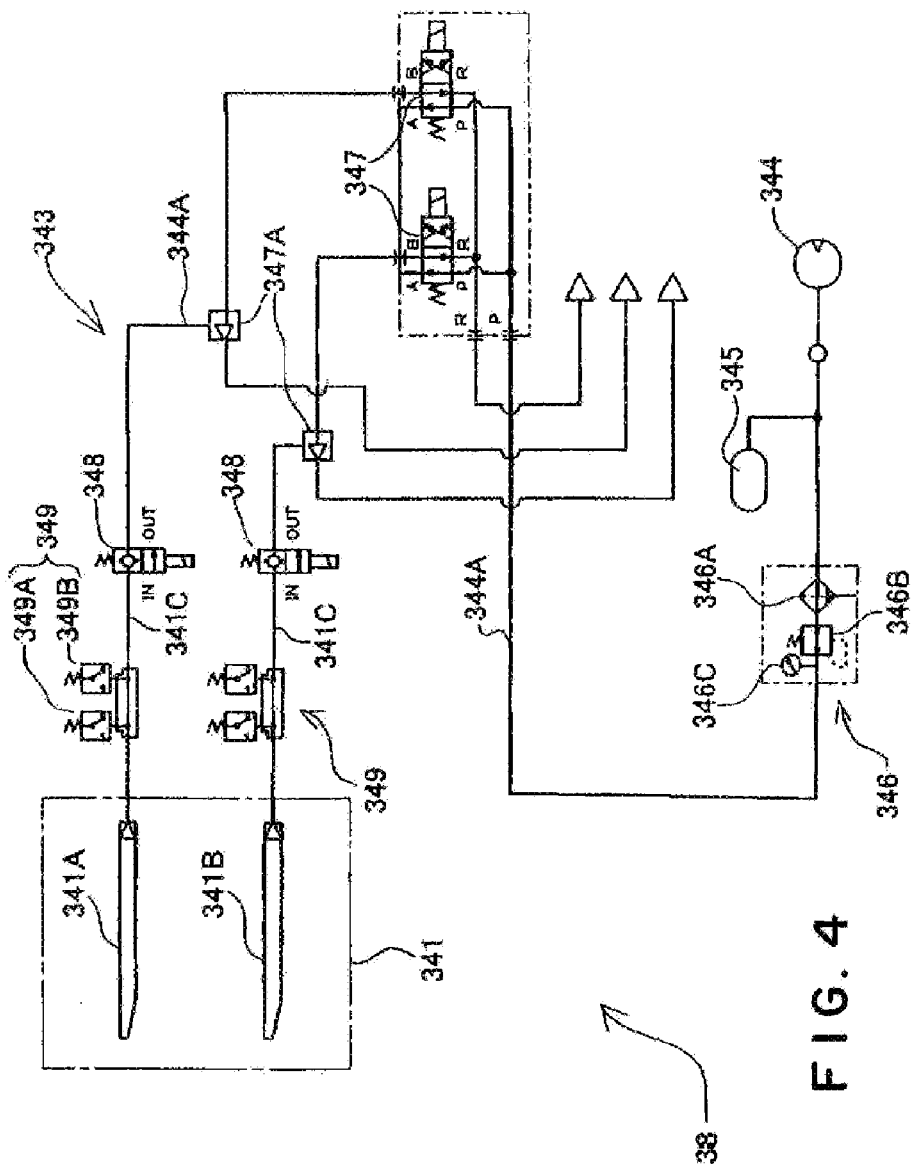
FIG. 4 is a circuit diagram showing the vacuum absorbing mechanism shown in FIG. 3.

The arm mechanism 34 is a wafer transporting mechanism which is mounted on the AGV 3. This arm mechanism 34 is constructed so as to enable rotation and elevation at the delivery of the wafer W. That is, as shown in FIGS. 2A and 2B, the arm mechanism 34 includes a vacuum holding device 38 having upper and lower arms (transfer arms) 341 on two stages to absorb the wafer W in vacuum, a reverse-rotatable base 342 movably supporting these arms 341 in front and behind and a driving mechanism (not shown) accommodated in the base 342. When transferring the wafer W, the upper and lower arms 341 individually move on the base 342 in front and behind by the driving mechanism, while the base 342 reverse-rotates in a direction to transfer the wafer W. As shown in FIGS. 3 and 4, the upper and lower arms 341 include respective vacuum absorbing mechanisms 343 each allowing the wafer W to be absorbed in vacuum by making use of a battery on board. Note, in the following descriptions, as occasion demands, one arm on the upper stage will be referred as "upper arm 341A", while the other arm on the lower stage is referred as "lower arm 341B".

Although a compressor that the AGV 3 can mount thereon is driven by a battery on board as mentioned above, the AGV 3 cannot be equipped with a battery more than a low-capacity battery of approx. 25V at most. Therefore, there is a shortage of airflow in order that the compressed air from the compressor is discharged from an ejector and utilized as a vacuum absorbing mechanism for the arm mechanism 34. That is, even if air is discharged from an ejector 347A by a small-sized compressor 344 that is energized by a battery on the AGV 3, it is impossible to suck and exhaust air in respective exhaust passages of the arms 341 sufficiently because of smallness in the flow rate of the compressor 344 and also impossible to absorb the wafer W on the arms 341, in vacuum. In such a situation, the above shortage in the flow rate of air is supplemented by applying a special contrivance as below to the vacuum holding device 38 (the vacuum absorbing mechanism 343).

That is, as shown in FIGS. 3 and 4, the vacuum holding device 38 includes the two-stage upper and lower arms 341 for absorbing the wafer W in vacuum, exhaust passages 341C formed in these arms 341 to open at a surface of the wafer W for absorption and a vacuum absorbing mechanism 343 connected with the exhaust passages 341C through a pipe 344A. The so-constructed vacuum holding device 38 is driven under the administration of the AGV controller 4.

As shown in FIG. 3, the vacuum absorbing mechanism 343 includes a compressor 344 driven by the battery on board, an air tank 345 storing air, which has been fed from the compressor 344 under pressure, with a designated pressure (for example, 0.45 MPa) in the form of compressed air, a gas-pressure control mechanism 346 for controlling a pressure of the compressed air flowing out of the air tank 345 and ejectors 347A for ejecting the pressurized air supplied from the gas-pressure control mechanism 346. Additionally, as shown in FIGS. 3 and 4, the vacuum absorbing mechanism 343 includes switching valves 347 each arranged between the gas-pressure control mechanism 346 and the ejector 347A to close the pipe 344A, pilot check valves 348 each arranged between the arm 341 and the ejector 347A to close the pipe 344A and pressure sensors 349 each arranged between the arms 341 and the pilot check valve 348 to detect a pressure in the exhaust passages 341C, thereby allowing the arms 341 to hold and release the wafer W With the compressor 344 that feeds air under pressure, the compressed air is once stored in the air tank 345. That is, by allowing the air tank 345 to once store a predetermined quantity of compressed air in spite of small flow rate of the small compressor 344 driven by the battery on board, it is possible to ensure the flow rate of air necessary to absorb the wafer W in vacuum. That is, by making use of the compressed air stored in the air tank 345, it is possible to ensure the flow rate of air necessary to absorb the wafer W in vacuum. As shown in FIG. 4, having an air filter 346A, a reducing valve 346B and a pressure meter 346C, the gas-pressure control mechanism 346 stores the compressed air in the air tank 345 and discharges the compressed air from the ejectors 347 to the outside, at a constant flow rate required for the vacuum absorption for the wafer W. Noted that an area indicated with diagonal lines of the pipe 344A represents a pressure-reducing area.

The switching valves 347 are formed by solenoid valves, as shown in FIG. 4. When the solenoid valves are excited, the gas-pressure control mechanism 346 is communicated with the arms 341. Except excitation of the solenoid valves, the gas-pressure control mechanism 346 is insulated from the arms 341. Therefore, when the switching valves 347 are excited, air of a constant pressure flows out of the gas-pressure control mechanism 346, thereby causing air to be discharged from the ejectors 347A and causing air to be sucked from the exhaust passages 341C of the arms 341 for exhausting. Then, if the arms 341 hold the wafer WE there is established a vacuum condition in the exhaust passages 341C (In FIG. 4, pressure reducing portions of the pipes 344A are also indicated as the exhaust passages 341C.) since the openings of the exhaust passages 344A are closed by the wafer W. As a result, the wafer W is absorbed in vacuum by the arms 341. At this time, the pressure sensors 349 detect respective degrees of vacuum in the exhaust passages 341C. Based on detection values by the sensors 349, the ON/OFF states of the solenoid valves 347A are controlled respectively. Additionally, with the consumption of air in the air tank 345, the ON/OFF state of the compressor 344 is controlled on the bases of a detection value by the pressure meter 346C. When the solenoid is excited, the corresponding pilot check valve 348 communicates the exhaust passage 341C of the arm 341 with the corresponding ejector 347A, thereby allowing air to be sucked from the exhaust passage 341C. While, when the solenoid is inactivated, the corresponding pilot check valve 348 closes the exhaust passage 341C to maintain a designated degree of vacuum. When canceling the vacuum absorption by the arms 341, the solenoids of the pilot check valves 348 have only to be excited to communicate the exhaust passages 341C with the ejectors 347A thereby releasing the passages 341C to the atmosphere.

Again, as shown in FIG. 4, each of the pressure sensors 349 has a first pressure switch 349A and a second pressure switch 349B both of which detect different pressures respectively. The first pressure switch 349A is a sensor that detects the presence of a wafer W on the arms 341, in detail, whether the pressure in the exhaust passage 341C becomes a pressure smaller than the atmospheric pressure by e.g. 25 kPa. Based on this detection, the first pressure switch 349A serves to inform the outside of the presence of the wafer W. On the other hand, the second pressure switch 349B is a sensor that detects a leakage of the pressure in the exhaust passage 341C, in detail, whether the pressure in the exhaust passage 341C becomes a pressure smaller than the atmospheric pressure by e.g. 45 kPa. If the inside pressure in the exhaust passage 341C becomes larger than the above pressure, then the second pressure switch 349B informs the outside of the occurrence of leakage in pressure. When the second pressure switch 349B detects the leakage of pressure, that is, the pressure in the exhaust passage 341C is increased (reducing a degree of vacuum), the corresponding solenoid valve 347 is excited on the ground of the detection results by the second pressure switch 349B and the pilot check valve 348 is opened to discharge the compressed air from the ejector 347A thereby reducing the pressure in the exhaust passage 341C. When the pressure of the second pressure switch 349B reaches a pressure smaller than the atmospheric pressure by more than 40 kPa, the solenoid valve 347 is inactivated and the pilot check valve 348 is closed to maintain so-established decompressed condition. Furthermore, when the pressure at the pressure meter 346C becomes less than a predetermined value, the compressor 344 is driven to supply the air tank 345 with compressed air.

Figure 5:
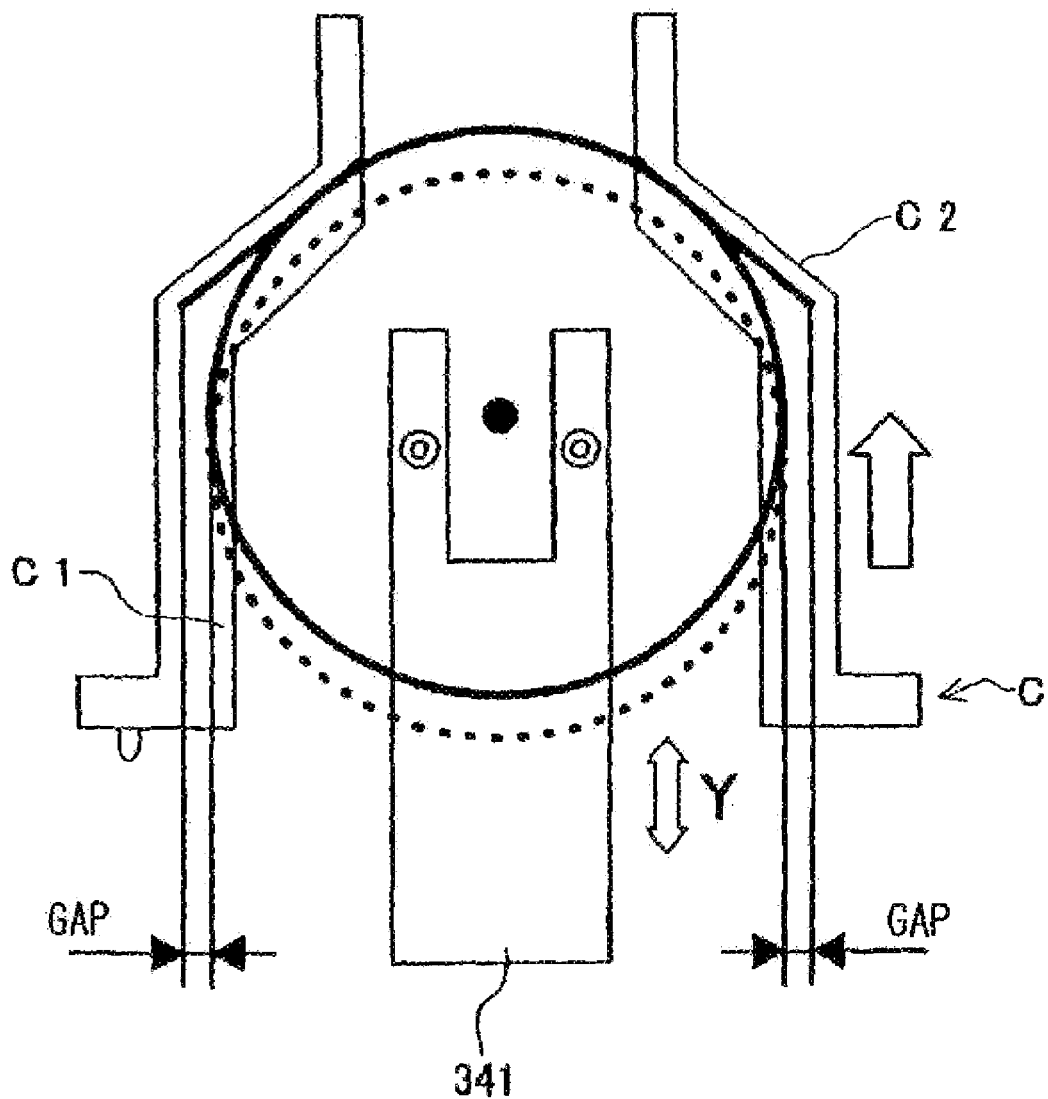
FIG. 5 is an explanatory view for explanation of a centering method for centering a wafer by using a carrier.

Meanwhile, when the AGV 3 reaches the delivery position for the wafers W of the prober 2, the arm mechanism 34 of the AGV 3 is driven to pick up the wafers W one by one. However, it is noted that, as shown in FIG. 5, the carrier C is provided, on its inner face, with e.g. twenty five grooves C1 in the vertical direction and the wafers W are inserted into these groove C1 in the horizontal arrangement. Therefore, since each wafer W is inserted into the groove C1 in the carrier C with play while remaining left and right gaps on both sides of the wafer W, there is a need for the wafer W to be centered by using e.g. an optical sensor after the wafer W has been unloaded from the carrier C by the arm mechanism 34. Therefore, according to the embodiment, the centering for the wafer W is carried out by making use of the carrier C.

That is, as shown in FIG. 5, the carrier C is provided with bilaterally symmetrical slanted faces C2 whose lateral faces are gradually narrowed toward the back face of the carrier C. The centering for the wafer W is accomplished by utilizing these slanted faces C2. For example, as shown in FIG. 5, the arm mechanism 34 is driven to bring the vacuum absorbing mechanism 343 into OFF state and further insert the arm 341 into the carrier C from the underside of a designated wafer W. During this insertion, the arm mechanism 34 is somewhat elevated to mount a wafer W on the arm 341. From this state, when the arm 341 is further inserted deep in the carrier C, the wafer W abuts on the left and right slanted faces C2 to a standstill during the wafer's movement from a position shown with broken line in the figure to the inside of the carrier C by the arm 341, while the arm 341 enters the inside of the carrier C deeply. Then, with the symmetrical arrangement of the left and right slanted faces C2, it is possible to allow the wafer W on the arm 341 to come in contact with the slanted faces C2 on both sides of the wafer W during a period for the arm mechanism 341 to push the wafer W into the carrier, thereby effecting the centering of the wafer W automatically. After completing the centering of the wafer W, the vacuum absorbing mechanism 343 is driven to hold the wafer W in vacuum by the arm 341. From this state, the arm 341 is withdrawn from the carrier C to pick up a wafer W from the carrier C. After picking up one wafer W from the carrier C in the above-mentioned way, the arm mechanism 34 rotates with 90 degrees to deliver a wafer W to the adapter 23 of the prober 2. In this way, since the centering for the wafer W can be accomplished at the AGV 3, there is no need to position the wafer W again when directly transferring the wafer W from the AGV 3 to the main chuck 26 in the prober chamber 22. That is, the centering of the wafer W at the AGV 3 means to arrange the wafer W in position when directly delivering it from the AGV 3 to the main chuck 26 in the prober chamber 22.

When the arm mechanism 34 of the AGV 3 transfers the wafer W to and from the adapter 3 of the prober 2, there is carried out the optically-coupled PIO communication between the prober 2 and the AGV 3, as mentioned before. For this purpose, the AGV 3 and the prober 2 have PIO communication interfaces 11A, 11B (see FIGS. 1A and 7) respectively, thereby performing the delivery of one wafer W precisely by mutual utilization of the PIO communication. Since the AGV 3 is equipped with the arm mechanism 34, the AGV 3 has signal lines to control the vacuum absorbing mechanism 343 of the arm mechanism 34 and the arms 341 in addition to the conventional communication line according to the SEMI standard.

The prober 2 is equipped, as a load port to deliver the wafer W, with one adapter (which may be referred as "load port" hereinafter, as occasion demands) 23. Nevertheless, in case of the single load port 23, it is impossible for the prober 2 to load the next uninspected wafer W until picking up the inspected wafer W, producing a limit in view of improving the throughout Accordingly, the conveyance method of the present invention comprises the steps of, making a communication between the AGVs 3, 3' and the prober 2 to decide respective timings of deliveries of the wafers W to/from the load port 23; and transporting the wafers W between the AGVs 3, 3' and the prober 2 via the load port 23, with the timings of the deliveries of the wafers W to/from the load port 23 shifted from each other by using a holding site for provisionally holding the wafer W The holding site is at least one of components of the AGVs 3, 3' and the prober 2 other than the load port 23.

Figure 6:
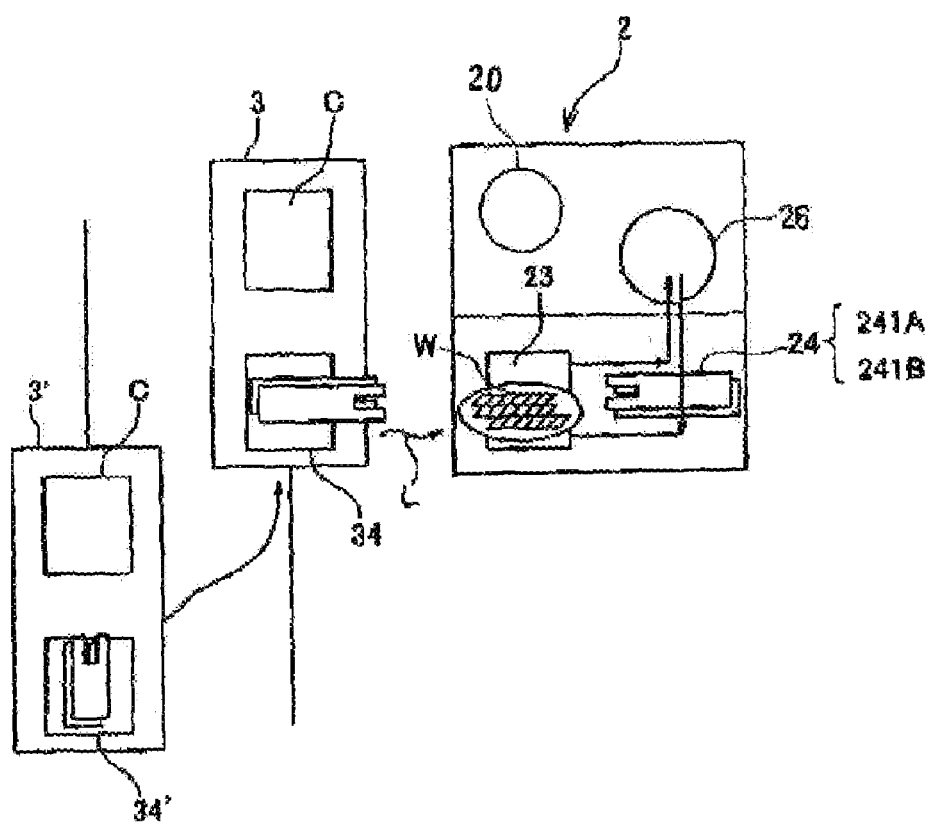
FIG. 6 is a view conceptually showing a conveyance method according to the present invention.

For example, as shown in FIG. 6, if there exists an inspected (processed) wafer W in the prober 2, it is impossible for the next AGV 3' to load an uninspected (unprocessed) wafer W unless the AGV 3 unloads the inspected wafer W Therefore, according to the conveyance method of the present invention, since the next AGV 3' obtains access to the prober 2 and carries out the PIO communication through a photo signal L to switch the "holding site" number of the signal lines of the PIO communication interfaces 11A, 11 is unloaded, it is possible to load a new wafer W in spite of the presence of the wafer W during or after inspection in the prober 2.

That is, when the holding site number of the communication interface 11B of the prober 2 is switched by the communication interface 11A of the AGV 3, a controller in the prober 2 is operated on a basis of the switching signal to determine the holding site automatically. That is, the controller includes searching means for searching one of plural holding sites, for example, the lower arm 241B for unloading, the sub-chuck 25, or the grinder-wafer table 20, on the ground of the switching signal and control means for controlling the arm mechanism 24 on a basis of the searching result at the searching means. The holding sites are respectively provided with sensors for detecting the presence of the wafer W Based on the detection signals from the sensors, the searching means searches a holding site for a wafer W Based on a sensor signal representing the absence of the wafer W, the searching means determines a holding site for provisionally holding the wafer W. After the holding site has been searched by the searching means, the control means drives the arm mechanism 24 to accommodate the wafer W before or after inspection in the so-searched holding site and further make the adapter 23 as the load port empty for the next-coming wafer W. In this way, owing to the timing-shift of the deliveries of the wafers W to/from the load port 23 by using the lower arm 241B and/or the grinder-wafer table 20 as the holding site, it is possible to make full use of the lower arm 241B, the sub-chuck 251 and/or the grinder-wafer table 20, thereby improving the throughput of the system. Further, since there is no need to provide a superfluous load port, it is possible to prevent the footprint and the system manufacturing cost from being increased.

Meanwhile, as shown in FIG. 7, the conveyance system E of this embodiment is equipped with the original PIO communication interfaces 81A, 11B in order to transfer a wafer W between the arm mechanism 34 of the AGV 3 and the adapter 23 of the prober 2 precisely. As shown in FIG. 7, these PIO communication interfaces 11A, 11B are respectively formed as 8-bit interfaces each having eight ports, respectively Signals shown in the figure are allocated to the first bit port to the eighth bit port. Optical signals (later-mentioned AENB signal, PENB signal, etc.) for controlling the sub-chuck 232 of the adapter 23 and the arm mechanism 34 of the AGV 3 are allocated to part of the bit ports.

With reference to FIGS. 8 to 16, we now describe the conveyance method for transporting the wafers W between the AGV 3 and the prober 2 while making use of the PIO communication by the PIO communication interfaces 11A, 11B FIGS. 8 to 16E show a method for loading a wafer W from the AGV 3 to the prober 3, FIGS. 13A to 13F a flow of the wafer W into the prober 2, and FIGS. 14 to 16E show a method for unloading the wafer W from the prober 2 to the AGV 3.

Figure 8:
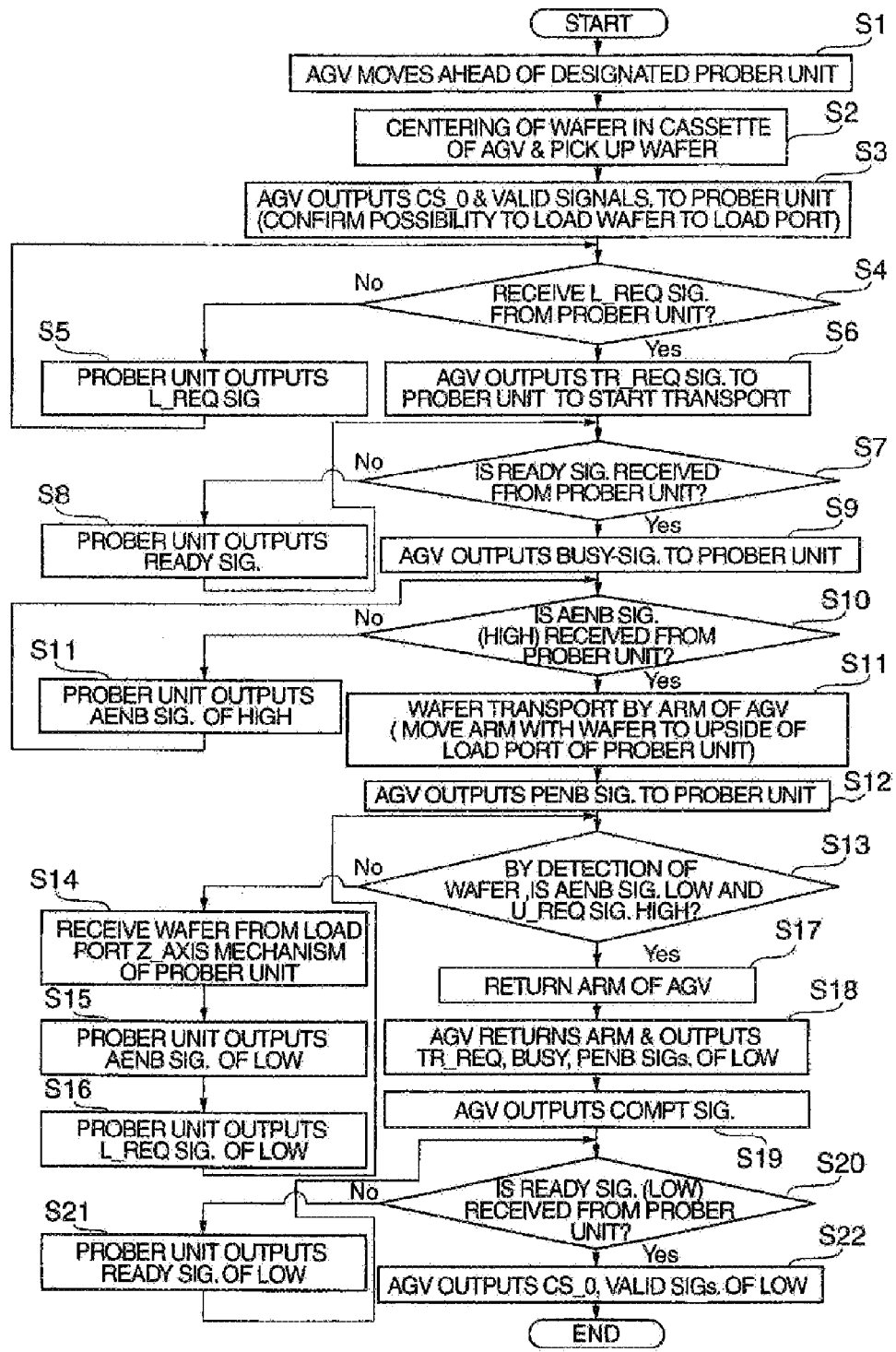
FIG. 8 is a flow chart showing a loading method for loading a wafer, which is applied to a wafer conveyance method using the conveyance system shown in FIGS. 1A and 1B.
Figure 10A:
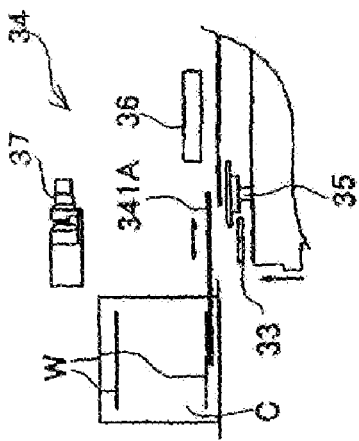
FIGS. 10A, 10B, 10C, 10D, 10E and 10F are process diagrams showing a loading process corresponding to the flow Chart of FIG. 8.
Figure 10B:
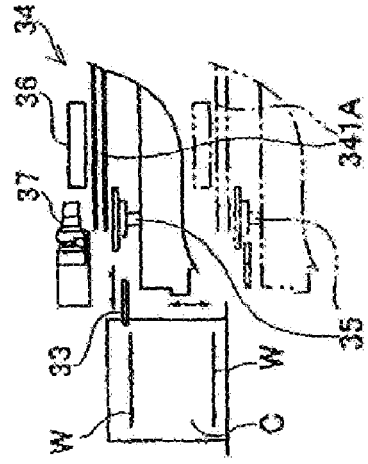
Figure 10C:
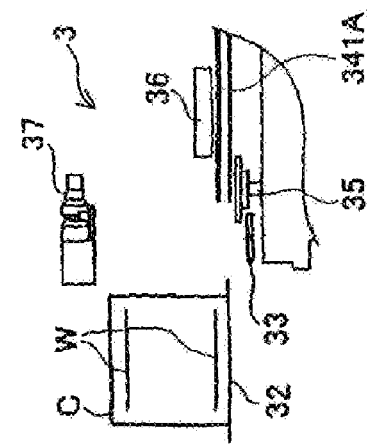

First, we now describe the wafer-loading method to deliver a wafer W from the AGV 3 to the prober 2. When the host computer 1 transmits a command for transporting the wafer W to the AGV controller 4 through the SECS communication, the AGV 3 moves to the front of the prober 2 (wafer delivery position) under the administration of the AGV controller 4, as shown in FIG. 8 (step S1). When the AGV 3 reaches the prober 2 as shown in FIG. 10A, the mapping sensor 33 advances toward the carrier C and the arm mechanism 34 moves up and down, as shown in FIG. 10B. After mapping of the wafers in the carrier C by the mapping sensor 33 during ascent and descent of the arm mechanism 34, the upper arm 341A of the arm mechanism 34 moves forward to enter the carrier C through the slight underside of a designated wafer W, as shown in FIG. 10C. During this operation, as shown in the flow chart of FIG. 8, the upper arm 341A and the carrier C carry out the centering of the wafer W (step S2). In detail, as shown in FIG. 10C, the arm mechanism 34 is slightly elevated to mount the wafer W on the upper arm 341A during its entering the remotest part of the carrier C and finally, the upper arm 341A reaches the remotest part of the carrier C. During this operation, the upper arm 341A makes the wafer W in contact with the symmetrical slanted faces C2 thereby performing the centering of the wafer W. Next, the vacuum absorbing mechanism 343 of the arm mechanism 34 is driven to absorb the wafer W in vacuum through the upper arm 341A. Thereafter; the upper arm 341A moves back from the carrier C to pick up the centered wafer W out of the carrier C (step S2). Since this centering operation allows the wafer W to be aligned with the main chuck 26 automatically, it is also possible to transfer the wafer W from the AGV3 to the main chuck 26 directly.

Figure 10D:
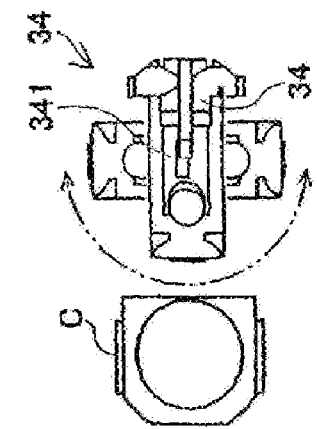
Figure 10E:
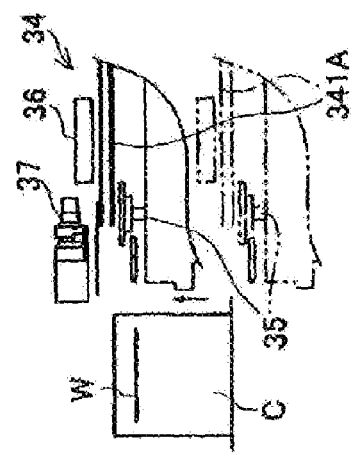
Figure 10F:
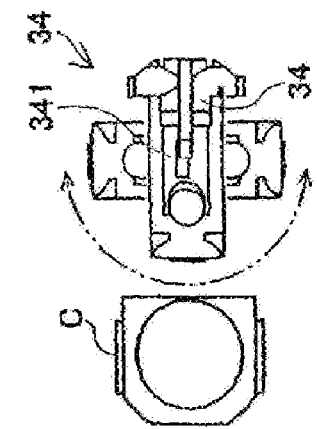

After the upper arm 341A has picked up the wafer W from the carrier C, the sub-chuck 35b is raised to receive the wafer W from the arms 341, as shown in FIG. 10D. Thereafter, during the rotation of the sub-chuck 35, the pre-alignment for the wafer W is carried out by the pre-alignment sensor 36. In succession, as shown in FIG. 10E, the sub-chuck 35 whose rotation came to a standstill is lowered and the arm mechanism 34 is elevated while returning the wafer W to the upper arm 341A. Then, the OCR 37 reads the ID cord on the wafer W in order to detect the lot number of the wafer W. Thereafter, as shown in FIG. 10F, the arm mechanism 34 is rotated by 90 degrees to accord the direction of the arm 341 with the adapter 23 of the prober 2, thereby realizing a condition shown in FIG. 1A. The ID cord of the wafer W discriminated by the OCR 37 is informed from the AGV to the host computer 1 via the AGV controller 4 and subsequently informed from the host computer 1 to the prober 2.

Figure 9:
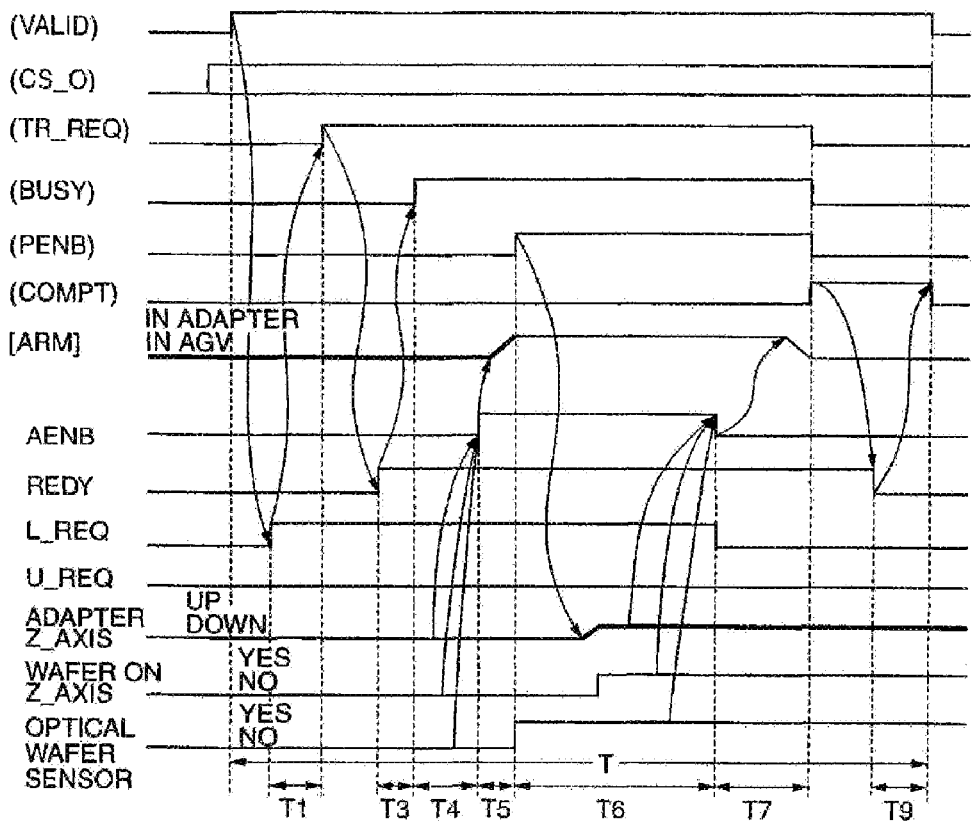
FIG. 9 is a timing chart of an optical communication applied to the loading method of FIG. 8.

Next, as shown in FIGS. 8 and 9, the PIO communication is started between the AGV 3 and the prober 2 by the PIO communication interfaces 11A, 11B. First, as shown in FIGS. 8 and 9, the AGV 3 transmits a CS-0 signal in a High state and a sequent VARID signal in a High state to the prober 2. If the CS-0 signal is in a High state, then the VARID signal in a High state is maintained to confirm whether the adapter (load port) 23 of the prober 2 is in a condition allowing the wafer W to be received (step S3). On receipt of the VALID signal, as shown in FIG. 9, the prober 2 turns its L-REQ signal to a High state and further transmits the signal to the AGV 3, thereby informing it of the possibility of loading a wafer.

As shown in FIG. 8, the AGV 3 judges whether the L-REQ signal has been received or not (step S4). When the AGV 3 judges no receipt of the L-REQ signal, the prober 2 transmits the L-REQ signal to the AGV 3 (step S5). When the AGV 3 judges receipt of the L-REQ signal, the AGV 3 turns a TR-REQ signal to a High state and transmits it to the prober 3 in order to start loading the wafer W (step S6). Further, the AGV 3 informs the prober 2 that the wafer W is prepared to be transported. On receipt of the TR-REQ signal, as shown in FIG. 9, the prober 2 turns its READY signal to a High state and further transmits the signal to the AGV 3, thereby informing it of the possibility for the load port 23 to get access.

The AGV 3 judges whether the READY signal has been received from the prober 2 or not (step S7). When the AGV 3 judges no receipt of the READY signal, the prober 2 transmits the READY signal to the AGV 3 (step S8), thereby informing it of the possibility to get access. When the AGV 3 judges receipt of the READY signal, as shown in FIG. 9, the AGV 3 turns a BUSY signal to a High state and transmits it to the prober 2 (step S9), thereby informing the prober 2 of the beginning of transporting the wafer W.

Next, as shown in FIG. 8, the AGV 3 judges whether an AENB signal has been received from the prober 2 or not (step S10). When the AGV 3 judges no receipt of the AENB signal, as shown in FIG. 9, the prober 2 turns the AENB signal to a High state and further transmits it to the AGV 3 (step S11) thereby informing of the possibility for the upper arm 341A to get access. The AENB signal is a signal that is transmitted to the AGV 3 when the prober 2 receives the BUSY signal in the High state, that is, a signal defined in order to deliver the wafer W in the present invention. That is, in loading a wafer W, the AENB signal is brought into its High state on condition that the sub-chuck 232 of the adapter 23 occupies its lowered position with no wafer W thereby to allow it to be loaded (condition enabling the upper arm 341A to get access). In unloading a wafer W, the AENB signal is brought into its High state on condition that the sub-chuck 232 occupies its raised position with the wafer W thereby to allow it to be unloaded (condition enabling the upper arm 341A to get access). While, in loading a wafer W, the AENB signal is brought into its Low state on condition that the sub-chuck 232 of the adapter 23 detects the wafer W to confirm the loading of the wafer W. In unloading a wafer W, the AENB signal is brought into its Low state on condition that the sub-chuck 232 does not detect a wafer W to confirm the unloading of the wafer W.

Therefore, at step S10, when the AGV 3 judges the receipt of the AENB signal in a High state, it is started to transfer (load) the wafer W from the AGV 3 (step S11) where the upper arm 341A of the arm mechanism 34 in the state of FIG. 11A advances toward the adapter 23 of the prober 2 and transfers the wafer W right above the load port 23, as shown in FIG. 11B.

Next, the AGV 3 transmits a PENB signal to the prober 2 (step S12) and it is judged whether the AENB signal is in a Low state and the L-REQ signal is in a Low state as a result of detecting the wafer W by the prober 2 (step S13). When the prober 2 judges that both of the above signals are in the High states and the sub-chuck 232 is in its lowered position without holding a wafer W allowing its access, the sub-chuck 232 is elevated and the vacuum absorbing mechanism 343 of the arm mechanism 34 releases vacuum absorption for the wafer, as shown in FIG. 11C. The PENB signal is defined in the present invention. In loading a wafer W, the PENB signal is brought into its High state when the vacuum absorbing mechanism 34 is inactivated to release the wafer W from the upper arm 341A and also brought into the Low state when the upper arm 341A returns the side of the AGV 3 and the loading operation of the wafer W is completed. In unloading a wafer W, the PENB signal is brought into its High state when the vacuum absorbing mechanism 34 is activated to absorb the wafer W by the lower arm 341B and also brought into the Low state when the lower arm 341B returns the side of the AGV 3 and the unloading operation of the wafer W is completed.

When the upper arm 341A releases the wafer W in the above-mentioned way, the sub-chuck 232 in the load port 23 receives the wafer W in vacuum absorption, as shown in FIG. 9 (step S14). In succession, as shown in FIG. 9, the prober 2 turns the AENB signal to the Low state and transmits it to the AGV 3 to inform it that the sub-chuck 323 is holding the wafer W (step S15). Simultaneously, the prober 2 turns the L-REQ signal to the Low state and transmits it to the AGV 3 (step S16), thereby informing it of the completion of loading operation. Consequently, the AGV 3 recognizes that the prober 2 cannot receive the next-coming wafer W at present.

Thereafter, the routine returns stop S13 where it is judged whether the AENB signal is in the Low state and the L-REQ signal is also in the Low state as a result of twice detecting the wafer W by the prober 2. When the prober 2 judges that the loading of the wafer W has been completed since both of the above signals are in the Low states, the upper arm 341A is returned from the load port 23 to the AGV 3 (step S17). When the upper arm 341A returns, the AGV 3 turns all of the TR-REQ, BUSY, PENB signals to their Low states and transmits the respective signals to the prober 2 to inform it of the completion of the loading operation (step S18).

Next, as shown in FIG. 9, the AGV 3 turns a COMPT signal to its High state and transmits it to the prober 2 to inform it of the completion of the transporting operation of the wafer W (step S19). At the AGV 3, it is judged whether the READY signal of the Low state has been received from the prober 2 (step S20). If the AGV 3 judges that the READY signal of the Low state is not received, then the prober 2 turns the READY signal to the Low state and transmits it to the AGV 3 to inform it of the completion of a series of transporting operation, as shown in FIG. 9 (step S21). When the AGV 3 judges that the READY signal of the Low state has been received, as shown in FIG. 9, the AGV 3 turns the CS-0 and VALID signals to their Low states and transmits them to the prober 2, thereby completing the transporting operation of the wafer W (step S22). Further, as shown in FIG. 11D, the arm mechanism 34 is rotated to the opposite direction by 90 degrees thereby getting ready for delivering the wafer W while waiting for an instruction of the hoist computer 1.

At the prober 2, as shown in FIG. 11E, the sub-chuck 232 receiving the wafer W in the adapter 23 is once lowered to carry out the centering of the wafer W in the adapter 23. Thereafter, as shown in FIG. 11F, the adapter 23 is lowered to a position to deliver the wafer W to the arm mechanism 23, while the sub-chuck 232 is raised up to the upside of the adapter body 231. In this state, the upper arm 241A of the arm mechanism 24 advances to the side of the adapter 23 as shown in FIG. 11G and further, the sub-chuck 231 of the adapter 23 falls and the upper arm 241A receives the wafer W in vacuum absorption.

Figure 12A:
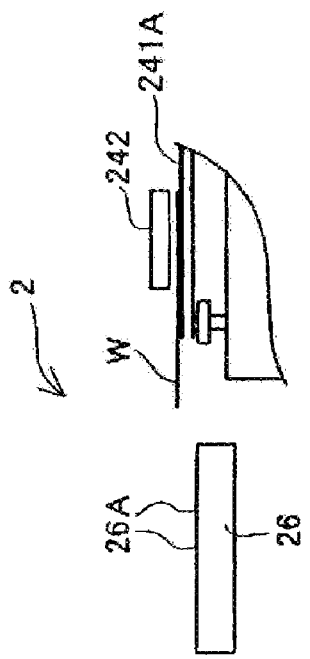
FIGS. 12A, 12B, 12C, 12D and 12E am process diagrams showing the flow of a wafer in the prober.
Figure 12B:
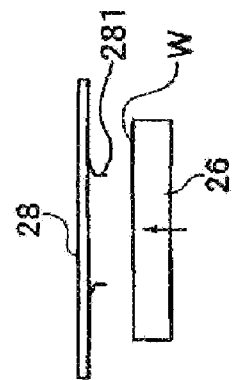
Figure 12C:
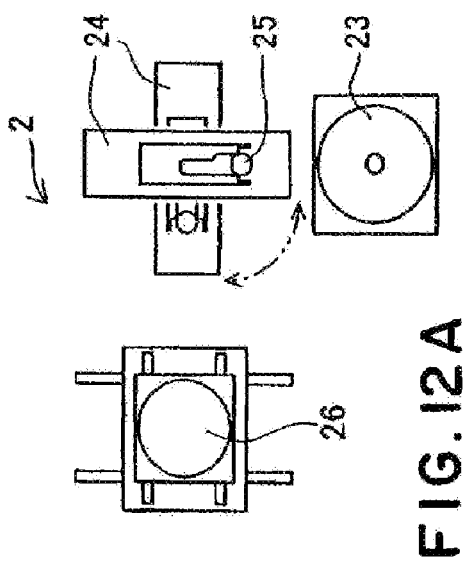
Figure 12D:
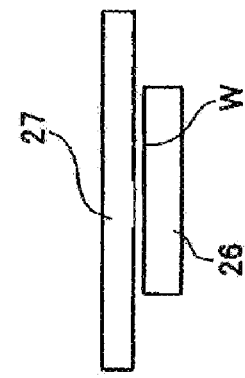
Figure 12E:
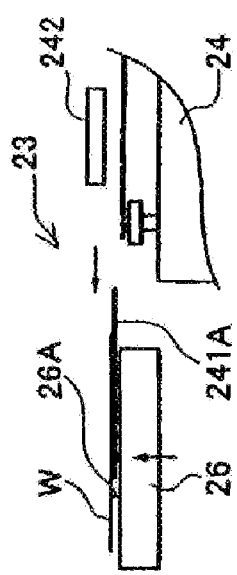

On receipt of the wafer W through the upper arm 241A, the arms 241 are turned toward the main chuck 26 in the prober chamber 22, as shown in FIG. 12A. Thereafter, as similar to the conventional prober, the pre-alignment for the wafer W is carried out by the arm mechanism 25 and the sub-chuck 24, as shown in FIG. 12B. Next, as shown in FIG. 12C, the wafer W is delivered to the main chuck 26. Further, after executing the alignment operation by the alignment mechanism 27 as shown in Fog. 12D, the electric characteristics of the wafer W is inspected by an electrical contact between the wafer W and the probe 281 of the probe card 28 while index-feeding the main chuck 26 as shown in FIG. 12E. Note, in FIGS. 12B and 12C, reference numerals 26A denote elevating pins for the wafer W.

During inspecting by the prober 2 receiving the wafer W, it is possible for the above AGV 3 on completion of the delivery of the wafer W to transfer the other wafers W in the same lot, to and from the other probers 2, in accordance with their demands under the control of the host computer 1 and also the above-mentioned procedure. Thereafter, the same inspection can be carried out in each of the probers 2, in parallel.

As shown in FIG. 6, according to the embodiment, if the other AGV 3' for transporting a wafer in the other lot different from the wafer W during inspecting gets access to this prober 2 during carrying out the inspection of the wafer W, the PIO communication is carried out between the other AGV 3' and the prober 2 through the PIO communication interfaces 11A, 11B, thereby determining the timings of the deliveries of the wafers W to/from the load port 23 and the holding site for shifting the timings from each other by switching the holding site number. Consequently, in the prober 2, the searching means of the controller is operated to search a storage site for the wafer W after or before inspecting. For example, the lower arm 241B of the arm mechanism 24 and the grinder-wafer table 20 may be employed as the storage site for the wafer W after inspecting. In case of designating the lower arm 241B as the storage site, after inspecting, the arm mechanism 24 receives the wafer W after inspecting from the main chuck 26 through the lower arm 241B. Then, the wafer W after inspecting is provisionally held by the lower arm 241B without returning the adapter 23, so that it is emptied in readiness for loading the next-coming wafer W Subsequently, the wafer W is transferred from the other AGV 3' to the adapter 23 in accordance with the same procedure as mentioned above. Continuously, the new wafer W is delivered to the main chuck 26 through the upper arm 241A of the arm mechanism 24 and subsequently, the above wafer W is inspected openly. If loading a new wafer W during the inspection of the preceding wafer W, the new wafer W is transferred from the other AGV 3' to the adapter 3 because of its empty, thereby waiting in readiness for the completion of the present inspecting of the preceding wafer W.

On completion of inspecting the electrical characteristics of the wafer W, this wafer W after inspecting is transferred from the main chuck 26 to the adapter 23. In transferring the inspected wafer W, there are assumed two cases one is that the adapter 23 is emptied; and another is that the next-coming wafer W stands in readiness for loading. In the former case with empty, as shown in FIG. 13A, the elevating pins 26A of the main chuck 26 are elevated to lift up the wafer W from the main chuck 26. In succession, as shown in FIG. 13B, the lower arm 241B of the arm mechanism 24 advances toward the main chuck 26 to receive the wafer W. Then, as shown in FIG. 13C, the arm mechanism 24 is rotated by 90 degrees to turn its leading end to the adapter 23. Thereafter, when the arm mechanism 24 advances toward the adapter 23 as shown in FIG. 13D, the sub-chuck 232 in the adapter 23 rises to receive the wafer W from the lower arm 241B, as shown in FIG. 13E. Subsequently, as shown in FIG. 13F, the AGV 3 moves ahead of the prober 2 under the control of the AGV controller 4. When the AGV 3 confronts the prober 2, the adapter 23 is elevated from a position shown with chain double-dashed lines of FIG. 13F up to a position to deliver the wafer W with solid lines in the figure, thereby standing in readiness for unloading the inspected wafer W.

In the latter case where the next wafer W is standing by, it is impossible to deliver the inspected wafer W carried by the lower arm 251B to the adapter 23. Therefore, while the lower arm 241B holds the inspected wafer W, the upper arm 241A is driven to transfer a new wafer W in the adapter 23 to the main chuck 26 in accordance with the procedure shown in FIGS. 11E to 11G and FIGS. 12A and 12B. Thereafter, the inspected wafer W retained by the lower arm 241B is delivered to the adapter 23 in accordance with the procedure shown in FIGS. 13D to 13F, thereby standing in readiness for unloading the inspected wafer W.

Figure 14:
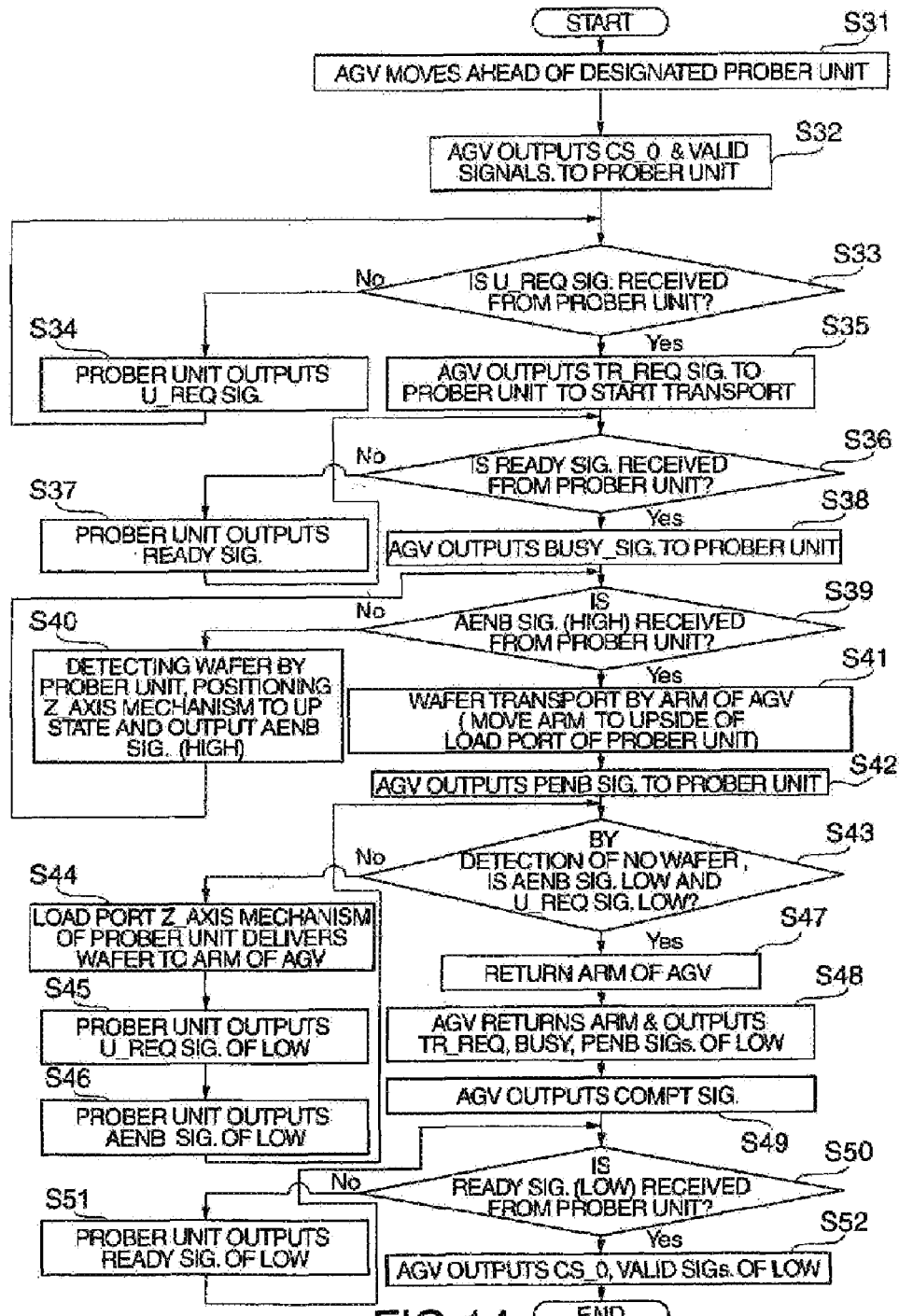
FIG. 14 is a flow chart showing an unloading method for unloading a wafer in accordance with the wafer conveyance method using the conveyance system shown in FIGS. 1A and 1B
Figure 15:
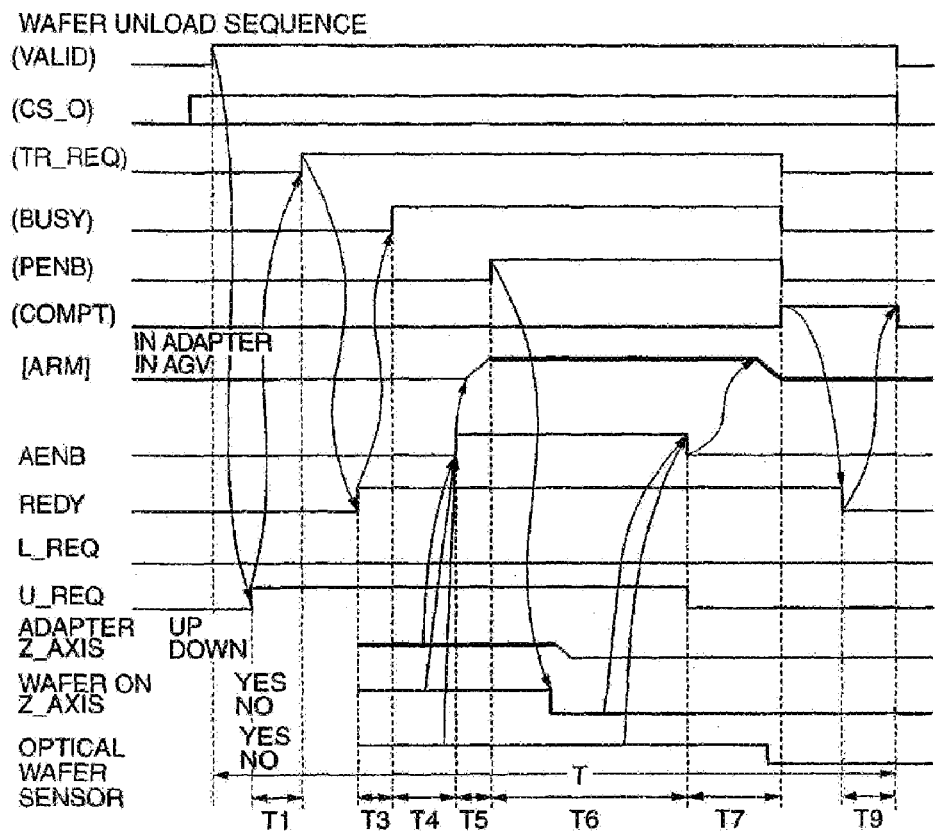
FIG. 15 is a timing chart of an optical communication applied to the unloading method of FIG. 14.

Next, the unloading method for delivering a wafer W from the prober 2 to the AGV 3 will be described with reference to FIGS. 14 to 16. As shown in FIGS. 14 and 15, when the AGV 3 moves ahead of a designated prober 2 on a basis of the instruction from the AGV controller 4 (step 31), the PIO communication between the AGV 3 and the prober 2 is started. The AGV 3 transmits the VARID signal to the prober 2 after transmitting the CS-0 signal (step S32). On receipt of the VALID signal, as shown in FIG. 15, the prober 2 turns an U-REQ signal to the High state and further transmits the signal to the AGV 3, thereby instructing it to unload the wafer W.

As shown in FIG. 14, the AGV 3 judges whether the U-REQ signal has been received or not (step S33). When the AGV 3 judges no receipt of the U-REQ signal, the prober 2 transmits the U-REQ signal to the AGV 3 (step S34). Consequently, if it is judged that the AGV 3 has received the U-REQ signal at step S33, then the AGV 3 turns the TR-REQ signal to the High state and transmits it to the prober 2 in order to start loading the wafer W, thereby informing the prober 2 that the wafer W is being prepared to be transported (step S35).

Next, at the AGV 3, it is judged whether the READY signal has been received from the prober 2 or not (step S36). When the AGV 3 judges no receipt of the READY signal, the prober 2 turns the READY signal to the High state and transmits it to the AGV 3 (step S37). If the AGV 3 receives the READY signal to judge the possibility to get access to the prober 2, as shown in FIG. 15, the AGV 3 turns the BUSY signal to the High state and transmits it to the prober 3 (step S38), thereby starting transporting the wafer W to the prober 2.

Figure 16B:
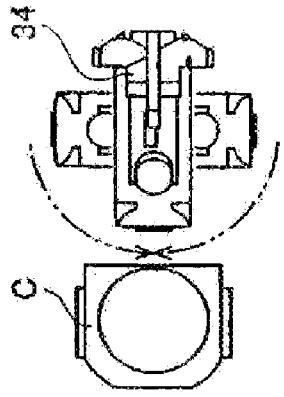
FIGS. 16A, 16S, 16C, 16D and 16E are process diagrams showing an unloading process corresponding to the flow chart of FIG. 14.
Figure 16A:
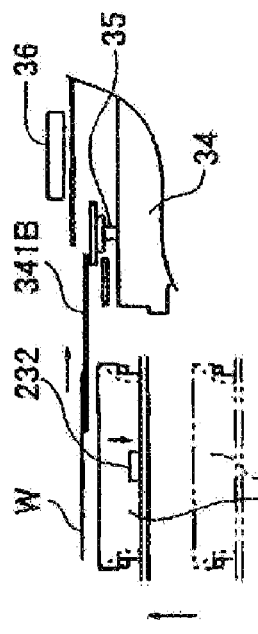

Next, as shown in FIG. 14, the AGV 3 judges whether the AENB signal of the High state has been received from the prober 2 or not (step S39). When the AGV 3 judges no receipt of the AENB signal, as shown in FIG. 15, the prober 2 turns the AENB signal to the High state and further transmits it (step S40). At step S39, when the AGV 3 receives the AENB signal in the High state to detect the wafer W in the prober 2 and further judges that the sub-chuck 232 in the load port 23 occupies its raised position thereby allowing the wafer W to be unloaded, the lower arm 341B moves from the AGV 3 up to a position right above the adapter 23, as shown in FIG. 16A (step S41).

Next, the AGV 3 activates the vacuum absorbing mechanism 343 and transmits the PENB signal in the High state to the prober 2 (step S42). Thereafter, it is judged whether the AENB signal is in the Low state and the U-REQ signal is in the Low state as a result of detecting the wafer W by the prober 2 (step S43). When the prober 2 judges that both of the above signals are in the High states and the sub-chuck 232 is capable of access, the adapter 23 is elevated and the sub-chuck 23 is lowered, as shown in FIG. 16A. Thereafter, the wafer W is absorbed in vacuum by the lower arm 341B of the arm mechanism 34 and further transferred from the adapter 23 to the arm mechanism 34 (step S44). Upon detection of removing the wafer W, the prober 2 turns the U-REQ signal to the Low state and transmits it to the AGV 3, thereby informing it of the removal of the wafer W, as shown in FIG. 15 (step S45). In succession, the prober 2 turns the AENB signal to the Low state and transmits it to the AGV 3, thereby informing it that the adapter 23 has no wafer W (step S46).

Thereafter, the routine returns step S43 where it is judged whether the AENB signal is in the Low state and the L-REQ signal is also in the Low state as a result of no wafer W at the sub-chuck 232, by the prober 2. When the prober 2 judges that the unloading of the wafer W has been completed since both of the above signals are in the Low states, the lower arm 341B is returned from the load port 23 to the AGV 3 (step S47). When the lower arm 341B returns, the AGV 3 turns all of the TR-REQ, BUSY, PENB signals to their Low states and transmits the respective signals to the prober 2 to inform it of the completion of the unloading operation (step S48). Thereafter, as shown in FIG. 15, the AGV 3 turns the COMPT signal to the High state and transmits it to the prober 2 to inform it of the completion of the unloading operation of the wafer W (step S49).

Figure 16E:
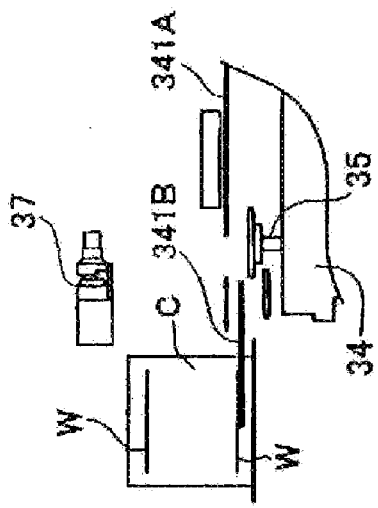
Figure 16D:
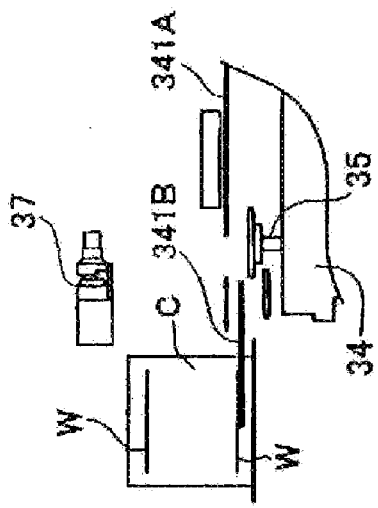
Figure 16C:
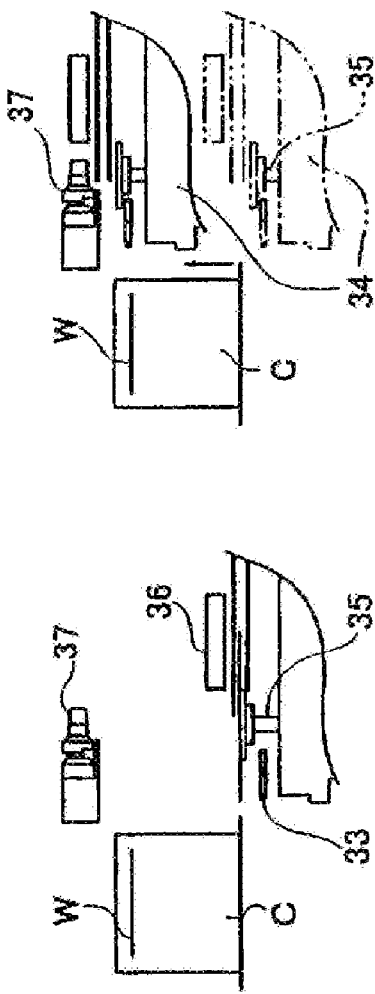

Next, at the AGV 3, it is judged whether the READY signal of the Low state has been received from the prober 2 (step S50). If the AGV 3 judges that the READY signal of the Low state is not received, then the prober 2 turns the READY signal to the Low state and transmits it, as shown in FIG. 14 (step S51) When the AGV 3 judges that the READY signal of the Low state has been received, as shown in FIG. 15, the AGV 3 turns the CS-0 and VALID signals to their Low states and transmits them to the prober 2, thereby completing the transporting operation of the wafer W (step S52). Further, as shown in FIG. 16B, the arm mechanism 34 is rotated to the opposite direction by 90 degrees. Thereafter, as shown in FIG. 16C, the sub-chuck 35 is elevated to receive the wafer W from the lower arm 341B and the orientation flat about the wafer W is detected by the pre-alignment sensor 36. In succession, as shown in FIG. 16D, the subchuck 35 falls to return the wafer W to the lower arm 341B and the arm mechanism 34 is elevated to read the ID-cord of the wafer W through the OCR 37. After that, as shown in FIG. 16E, the lower arm 341B is accommodated into the original position.

As mentioned above, according to the embodiment, since the utilization of the conveyance system E for objects to be processed, which includes the plural probers 2 for inspecting the electric characteristics of the wafers W under administration of the host computer 1 the AGV 3 for automatically transporting the wafers W in carrier unit to deliver the wafers W one by one in accordance with respective demands for these probers 2; and the AGV controller 4 for controlling the AGV 3 under the administration of the host computer 1, enables automatic transportation of the wafers W in carrier unit, it is possible to automatize the transporting operation of the wafers W thereby realizing a reduction in the number of operators. Additionally, since each prober 2 can deliver the wafers W in sheet unit to inspect it and the wafers W can be processed in parallel by plural probers 2, it is possible to accomplish an abbreviation in the TAT for the wafers W. Further, with the reduction in the number of operators, it is possible to contribute to a reduction in inspecting cost and a rise in the cleanness of a clean room.

Again, according to the embodiment, since the prober 2 has the adapter 23 for delivering the wafers W one by one and the AGV 3 includes the carrier mount 32 for mounting the wafers W in carrier unit and the arm mechanism 34 for transferring the wafers W one by one between the carrier mount 32 and the prober 2, it is possible to precisely deliver the wafers W, which has been brought in carrier unit, one by one to the plural probers 2 in accordance with respective demands on the probers 2, realizing the probers 2 in sheet unit more certainly Further, since the prober 2 and the AGV 3 carry out mutual optical communications through the optically-coupled PIO interfaces 11A and 11B respectively, it is possible to deliver the wafers W one by one more certainly and more precisely, due to the synchronous and certain drives of the sub-chuck 232 of the adapter 23 and the arm mechanism 34 of the AGV 3. Moreover, owing to the adoption of the interfaces 11A, 11B compliant with the SEMI standard, it is possible to realize the optical communication in low price.

Additionally, since the AGV 3 includes the OCR 37 for discriminating kinds of the wafers W, it is possible to discriminate a wafer W before inspecting certainly, allowing the wafers to be inspected without fault every lot. Again, since the AGV 3 is capable of alignment of the wafer W by performing the centering of the wafer W though the arm mechanism 34 and the carrier C in delivering the wafer W, it is possible to transfer the wafer W from the AGV 3 to the main chuck 26 of the prober 2 directly Note, the present invention is not limited to the above-mentioned embodiment only, but may be modified in its design as occasion demands, appropriately. For example, although the prober 2 has only the adapter 23 in the above-mentioned embodiment, the prober 2 may be provided with a plurality of storage sites for a plurality of wafers W. Then, it is possible to make use of these storage sites as imaginary load ports. Additionally, the vacuum absorbing mechanism 34 used in the arm mechanism 34 of the AGV 3 may employ an appropriate circuitry as occasion demands, as well Further, by only making a simple alternation to the loader chamber, the prober 2 of the embodiment could inspect the wafers in carrier unit, as usual.

Further, as mentioned above, according to the embodiment, after establishing the imaginary load port 23V that is different from the actual load port (the adapter 23) of the prober 2 by using the optically-coupled PIO communication, the lower arm 241B of the arm mechanism 23 is selected as a different position from the adapter 2 and further, the wafer W after inspection is held by this lower arm 241B. Thereafter, the next-coming wafer W is transferred to the adapter 23. Therefore, it is possible to keep the conveyance system at full operation while eliminating the play of the probers 2 as possible, thereby improving the throughput of inspection and also possible to prevent the footprint and manufacturing cost from increasing.

Further, according to the embodiment, the wafers W are transferred one by one in order to apply the sheet-processing on the wafers. Therefore, with the recent large-diameter and hyperfineness of a wafer, even if there is a jump in the number of devices to be formed in a single wafer thereby causing a processing period for one wafer to be extended at a jump, the wafer W could be directly unloaded as soon as completing the inspection and transferred to the next-coming process, whereby it is possible to realize the curtailment of TAT (turn-around-time).

Additionally, according to the embodiment, since the prober 2 has one actual load port (the adapter 23), it is possible to realize the curtailment of TAT (turn-around-time) by adopting the imaginary load port 23V despite that the number of actual load ports is one.

Note, the present invention is not limited to the above-mentioned embodiment only, but may be modified in its design as occasion demands, appropriately For example, although the wafers W are transferred one by one between the prober 2 and the AGV 3 by the optically-coupled PIO communication in the above-mentioned embodiment, the present technique is applicable to transfer a carrier therebetween, and the PIO communication may be replaced by the other communicating medium (for example, radio communication etc.). Further, an RGV or a remote-controllable conveyance device may be employed in place of the AGV 3. Although the above-mentioned embodiment has been described by an example of the prober 2 as a semiconductor manufacturing device, the present invention is widely applicable to a semiconductor manufacturing device that applied a designated process on objects to be processed, such as wafers.

As mentioned above, according to the embodiment, the conveyance system includes the plural probers 2 for inspecting the electric characteristics of the wafers W and the AGV 3 for automatically transporting the wafers W in carrier unit to deliver the wafers W one by one in accordance with respective demands for these probers 2. Further, the prober 2 and the AGV 3 include the adapter 23 and the arm mechanism 34 both of which transfer the wafers W one by one to, each other, the group controller 5 and the AGV controller 4 both controlling the adapter 23 and the arm mechanism 34 respectively, and the PIO communication interfaces 11A, 11B both receiving and transmitting the control signals of these controllers 5, 4 as optical signals. Therefore, the optical communication through the PIO communication interfaces 11A, 11B allows the adapter 23 and the arm mechanism 34 to be controlled to carry out the delivery of the wafers W in sheet unit between AGV 3 and the plural probers 3 certainly Further, since the wafers W are processed in parallel by using the plural probers 2, it is possible to realize the curtailment of TAT.

Again, according to the embodiment, the adapter 23 includes the elevating sub-chuck 232 for supporting a wafer W and the vacuum absorbing mechanism (not shown) arranged on the sub-chuck 232 to absorb the wafer W in vacuum. The arm mechanism 34 includes the two-stage arms 341A, 341B for transporting the wafers W one by one and the vacuum absorbing mechanism 343 for absorbing the wafer W on these arms 341A, 341B in vacuum. Further, the PIO communication interfaces 11A, 11B includes signal ports for transmitting and receiving optical signals to control the respective vacuum absorbing mechanisms 343 for the adapter 23 and the arm mechanism 34. Therefore, the optical communication through the PIO communication interfaces 11A, 11B allows the vacuum absorbing mechanisms 343 to be precisely controlled to absorb and release the wafer W through the sub-chuck 232 or the arms 341A, 341B certainly, thereby accomplishing the precise delivery of the wafer W.

As mentioned above, according to the embodiment, when picking up a plurality of wafer W supported horizontally in the carrier C of the AGV 3, the arm 341 is firstly inserted into the carrier C. After mounting the wafer W on the arm 341 into contact, the arm 341 is further inserted into the carrier C while making the wafer W in contact with the symmetrical slanted faces C2 formed inside of the carrier C. As a result, the wafer W is shifted to the center of the arm 341 in the width direction, thereby completing the centering of the wafer W in its lateral direction. Similarly, the movement of the arm 341 is stopped in a designated position thereby completing the centering of the wafer W in its fore-and-aft direction and after that, the wafer W is absorbed on the arm 341 in vacuum. Therefore, when picking up the wafer W from the carrier C through the arm 341, it is possible to center the wafer W automatically, whereby an exclusive process to center the wafer W can be eliminated with a sensor for centering. Then, it is also possible to contribute to an improvement in the throughput of the system and a reduction in cost.

Note, although the centering of the wafer W is carried out on the AGV 3 in the above-mentioned embodiment, the present invention is also applicable to a case of arranging a carrier in the semiconductor manufacturing device, such as prober, and further picking up wafers one by one from the carrier in order to perform a designated process, such as inspection. In brief, any method will be involved in the present invention so long as the centering operation of a wafer is carried out in a carrier before processing the wafer As mentioned above, according to the embodiment, since the system includes the arm 341 for holding the wafer W in absorption, the exhaust passage 341C formed in the arm 341 to open at the wafer's surface to be absorbed and the vacuum absorbing mechanism 343 connected with the exhaust passage 341C though the pipe 344A and further, since the vacuum absorbing mechanism 343 includes the compressor 344 driven by the battery on board, the air tank 345 for storing gas fed from the air tank 345 under pressure, in the form of compressed gas, the gas-pressure control mechanism 346 for controlling a pressure of the compressed gas flowing out of the air tank 345 and the ejector 347A for ejecting pressure-gas supplied from the gas-pressure control mechanism 346, it is possible to certainly absorb the wafer W on the arm 341 in vacuum by the following steps of storing air, which has been fed under pressure from the compressor 344 driven by the battery on the AGV 3, in the air tank 345 in the form of compressed air and subsequently ejecting the compressed air from the ejector 347A while adjusting a pressure of the compressed air by the gas-pressure control mechanism 346.

According to the embodiment, since the system is equipped with the two-stage arms 341A, 341B, it is possible to use the upper arm 341A for loading a wafer and the lower arm 341B for unloading a wafer exclusively, whereby the conveyance capability for the wafers W can be enhanced Further, since the switching valve 347 for closing the pipe 344A is arranged between the gas-pressure control mechanism 346 and the ejector 347A, it is possible to switch the vacuum absorbing mechanism 343 on and off through the switching valve 347 certainly Since the pilot check valve 348 for closing the pipe 344A is arranged between the arms 341 and the ejector 347A, it is possible to control the vacuum holding for the wafer W and its releasing through the pilot check valve 348 certainly. Since the pressure sensor 349 is provided to detect a pressure in the exhaust passage 341C between the arms 341 and the pilot check valve 348, it is possible to detect the degree of vacuum in the exhaust passage 341C through the pressure sensor 349 thereby detecting the holding situation of the wafer W on the arms 341 and also possible to switch the compressor 344 on and off on a basis of a the detected value.

Note, the present invention is not limited to the above-mentioned embodiment only, but may be modified in its design as occasion demands, appropriately. For example, valves or the others used in an air circuit of the vacuum absorbing mechanism 343 may be altered as occasion demands. The gist of the present invention resides in that the compressor 344 stores the compressed air in the air tank 345 thereby ensuring the flow rate of air etc. against the shortage in flow rate of the compressor 344 used as the vacuum absorbing mechanism 343 that absorbs the wafer in vacuum.

Meanwhile, FIGS. 17A and 17B are views showing a centering device in accordance with the embodiment, which may be used as the adapter in the above-mentioned embodiment. Therefore, the centering device of the embodiment applied to the conveyance method of the objects to be processed of the above-mentioned embodiment will be described white putting the same numerals as the above-mentioned embodiment on respective installations except the centering device. In this embodiment, as described later, since both of the centering and the pre-alignment are performed in the loader chamber, an OCR and an optical sensor for pre-alignment are unnecessary for the AGV 3 and the centering of the wafer W is unnecessary in a cassette.

As shown in FIG. 17A, a centering device 50 of this embodiment includes a plate 502 that partitions the interior of a frame body 501 up and down, a wafer support 503 arranged in the substantial center on the plate 502 and a centering mechanism 504 receiving a wafer W on the wafer support 503 for centering the wafer W, and is movable up and down through an indexer.

The above wafer support 503 has a shaft 503A penetrating the plate 502 and further connected with an air cylinder 506 fixed to the back face of the plate 502, thereby allowing the support 503 to move up and down, as shown with an arrow A of FIG. 17A. A plurality of concentric grooves and radial grooves are formed on the surface of the wafer support 503, while vacuum exhaust passages open at appropriate ones of these grooves. The vacuum exhaust passages are connected with a vacuum exhaust device (not shown). By the vacuum exhaust device, a space between the grooves of the wafer support 503 and the wafer W is evacuated to absorb the wafer W on the surface, in vacuum.

Further, as shown in FIG. 17A, the above centering device 504 includes a pair of left and right centering plates 504A arranged on both left and right sides of the wafer support 503 in view from the wafer transporting mechanism 24 of the prober 2 so as to interpose it while supporting the wafer W from left and right, shafts 504B suspended from the substantial centers of the centering plates 504 in the longitudinal direction to penetrate through long holes 502A formed in the plate 502 in the right-and-left direction, a link mechanism 504C connecting the left and right shafts 504B with each other on the backside of the plate 502 and an air cylinder 504D connected with the link mechanism 504C. Consequently, the wafer W is centered by expansion and contraction of the left and right centering plates 504A by the air cylinder 504D and the link mechanism 504C as shown in arrows B of the FIG. 17A. On each surface of the centering plates 504A, circular surfaces 504E, 504F matching the diameters of the wafers W having different bore diameters are formed to pinch the wafers W having different bore diameters of, for example, 200 mm and 300 mm.

Therefore, when receiving a wafer W of e.g. 200 mm from the wafer support 503, the left and right centering plates 504A are brought into a condition expanded more than the bore diameter of the wafer. Under this condition, when the centering plates 504A receive a wafer W from the wafer support 503, the left and right centering plates 504 approach each other due to the air cylinder 504D and the link mechanism 504C, so that the left and right circular surfaces 504E or the circular surfaces 504F nip the wafer W therebetween, thereby centering the wafer W.

Accordingly, as described before, the arm mechanism 34 of the AGV 3 rises to pick up a designated wafer W from a buffer cassette 32 through the upper arm 341. After shrinking the upper arm 341, the wafer transporting mechanism 34 rotates through the base 341 by an angle of 90 degrees to face the arm 341 toward the adapter of the prober 2, i.e. the centering device 50 of the embodiment, as shown in the same figure. In succession, when the upper arm 341 advances as shown in FIG. 17A, the wafer W reaches the upside of the wafer support 503 of the centering device 50, as shown in FIG. 17B. Then, the wafer support 503 is elevated by the air cylinder 506. After the support's receiving the wafer W in vacuum absorption from the upper arm 341 as shown in FIG. 17B, the water support 503 is lowered by the air cylinder 506. Then, the wafer W is transferred from the wafer support 503 onto the centering plates 504A already expended left and right, as shown in FIG. 17A. Further, the vacuum absorption of the wafer support 503 is canceled and the wafer W is delivered onto the centering plates 504. When the left and right centering plates 504 approaches each other by the air cylinder 504D and the link mechanism 504C, the wafer W is pinched by the left and right circular surfaces 504E thereby effecting the centering of the wafer W automatically. Thus, even if the wafer W has been deviated from the center of the wafer support 503, it is possible to correct the position of the wafer W to the center on the centering plates 504A.

After centering the wafer W in the loader chamber 21, as shown in FIG. 17A, the arm 241 of the wafer transporting mechanism 24 is driven to advance into the centering device 50, so that the wafer W is absorbed in vacuum on the arm 241 and the left and right centering plates 504A are expanded. Next, after making the arm 241 move back from the centering device 50, the wafer transporting mechanism 24 transports the wafer w to the prober chamber 22. During this transportation of the wafer W, the pre-alignment of the wafer W is carried out by the sub-chuck 25 and the ID-cord on the wafer W is read out by the OCR. After the pre-alignment, the arm 241 is directed to the prober chamber 22 on receipt of the wafer W from the sub-chuck 25 through the arm 241 of the wafer transporting mechanism 24.

During this operation, the main chuck 26 moves to its standby position in the prober chamber 22. Here, when the wafer transporting mechanism 24 expands the arm 24, then the wafer W is delivered to the main chuck 26. The mounting of the wafer W on the main chuck 26 causes the absorbing mechanism 30 to be driven to absorb the wafer W in vacuum on the main chuck 26. After the inspection, the wafer W is returned to the centering device 50 in the inverse course.

As mentioned above, according to the embodiment, even if the accuracy to transfer the wafer W from the AGV 3 to the prober 2 is deteriorated, it is possible to transfer the wafer W from the AGV 3 to the prober 2 certainly due to the certain centering of the wafer W by the centering mechanism 504.

Figure 18A:
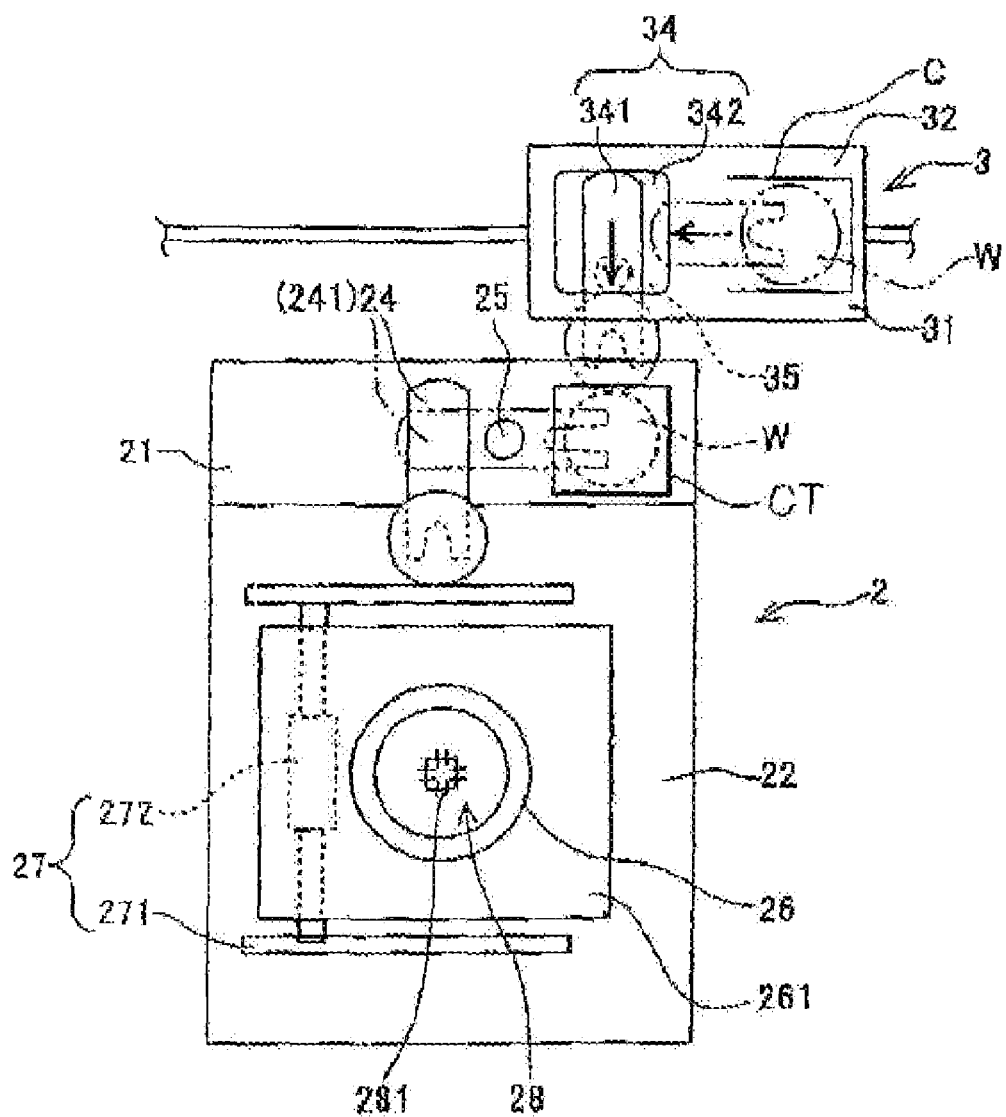
FIG. 18A is a plan view conceptually showing a state to transfer a wafer between an alternative prober and the AGV in and FIG. 18B is a side view showing the essential part of FIG. 18A.
Figure 18B:
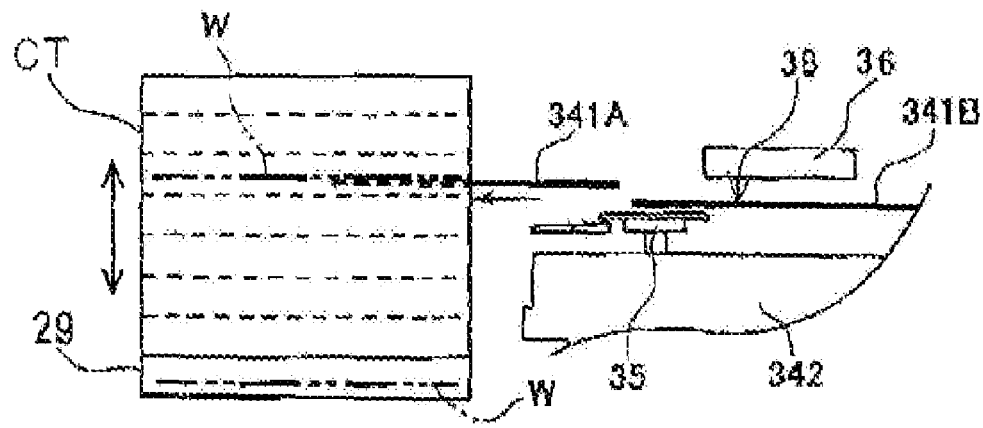

FIGS. 18A and 18B show an alternative prober 2'. The alternative prober 2' comprises a wafer cassette CT and an unloading table 29 instead of the adapter 23 and the grinder-wafer table 20 shown in FIGS. 2A and 2B. The wafer cassette CT is provided as the load port and is configured to store a plurality of wafers W vertically spaced apart from each other at an equal pitch. The unloading table 29 is arranged below the cassette CT to provisionally place thereon the wafer W. The unloading table 29 and the cassette CT are configured to move integrally in the vertical direction. In this alternative prober 2', it is possible to use the unloading table 29 as the holding site. The grinder-wafer table 20 may be also provided in this alternative prober 2'.

Figure 19:
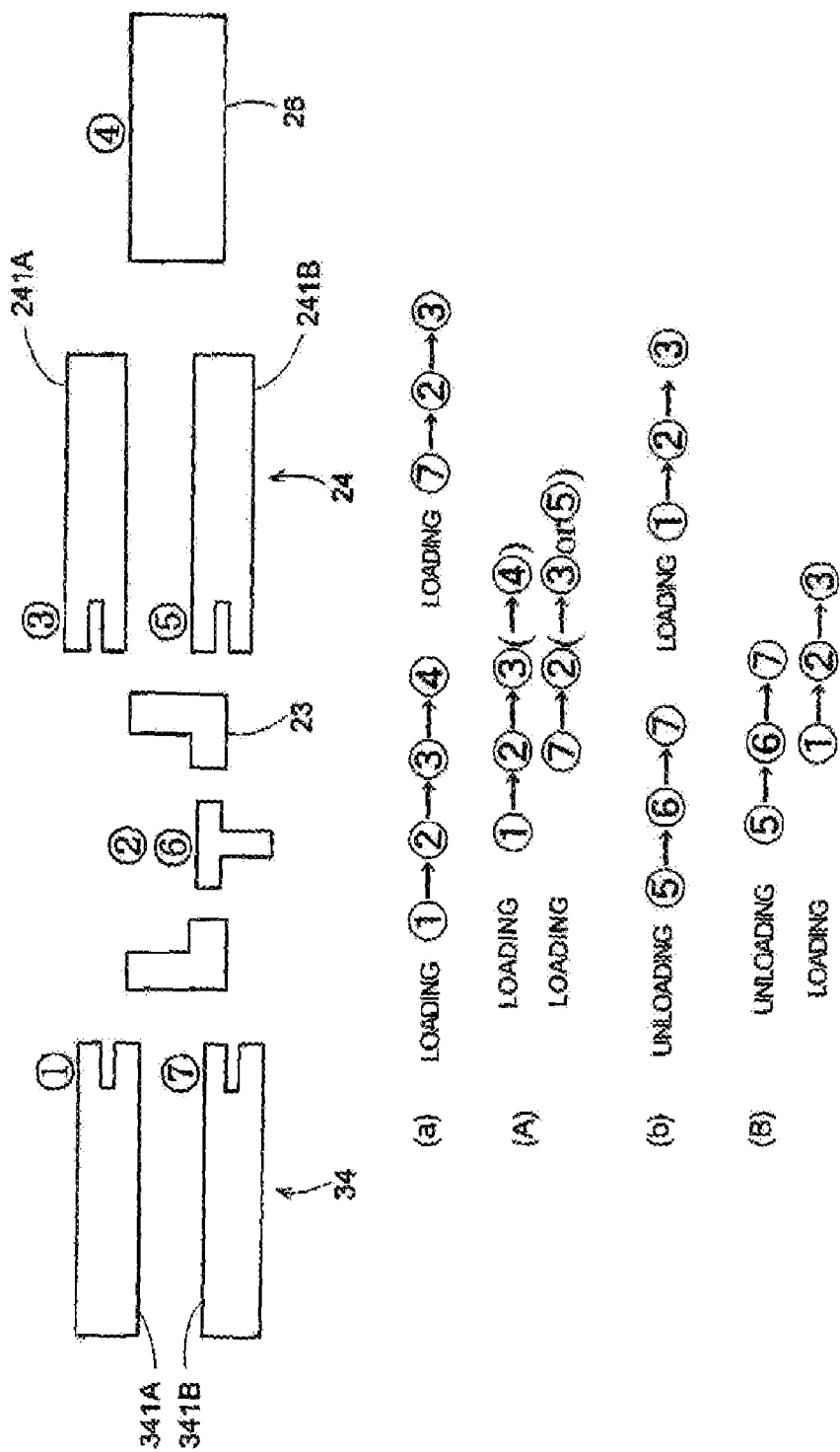
FIG. 19 is a diagram showing two typical embodiments of the conveying method according to the present invention.

FIG. 19 shows two typical embodiments (A) and (B) of the conveying method according to the present invention. FIG. 19 also shows two conventional conveying methods (a) and (b) compared with the respective embodiments (A) and (B). The order and the timing of wafer transportation are denoted by the encircled numbers 1-7. In the embodiments of FIG. 19, one of the upper and lower arms 241A, 241B (encircled numbers 3, 5) of the prober arm mechanism 24 and the lower arm 341B (encircled number 7) of the AGV arm mechanism 34 is used as the holding site for shifting the timings of the deliveries of the wafers to/from the load port 23 (encircled numbers 2, 6) from each other.

Figure 20:
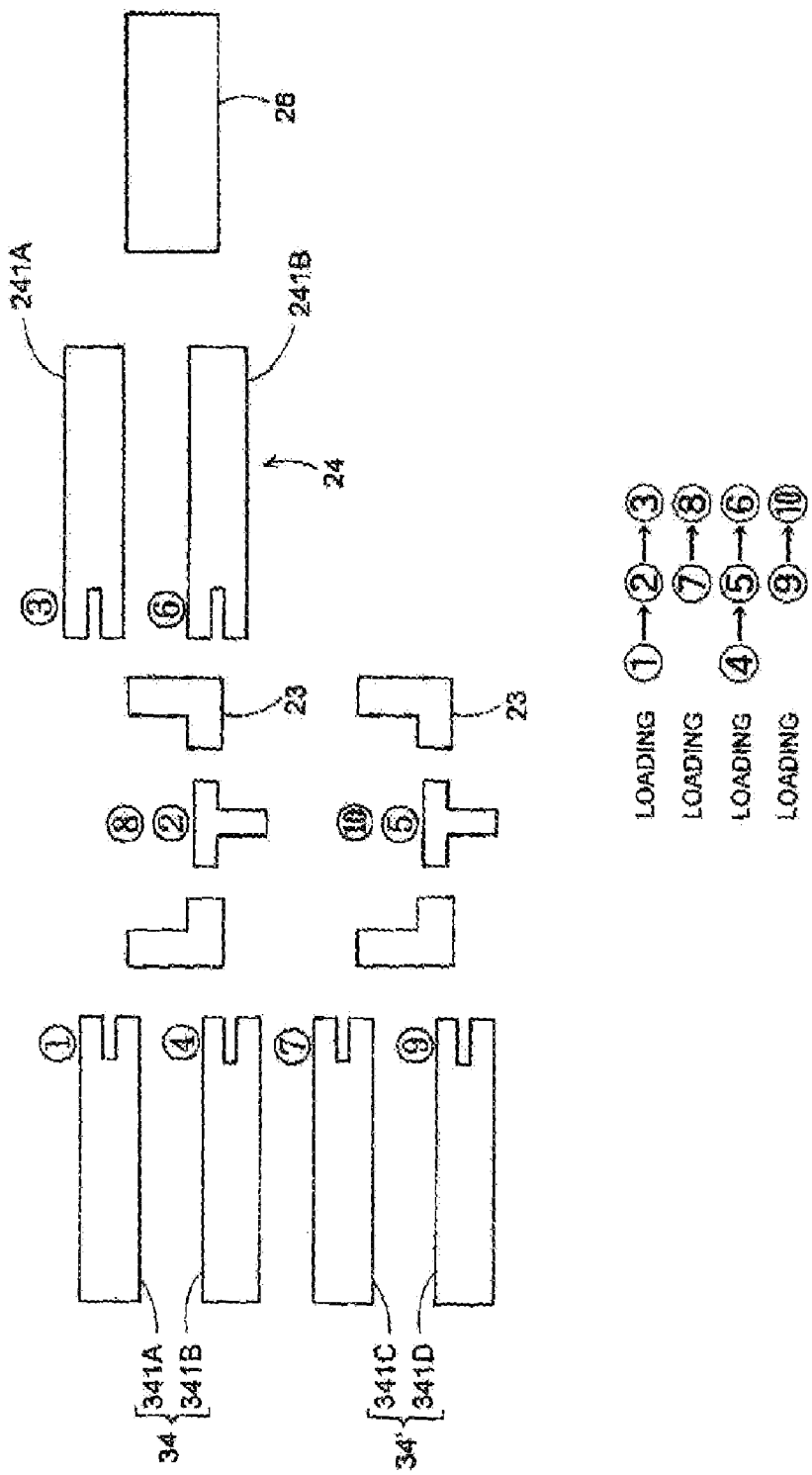
FIG. 20 is a diagram showing another typical embodiment of the conveying method according to the present invention.

FIG. 20 shows another typical embodiment of the conveying method according to the present invention. In the embodiment of FIG. 20, there is provided an additional AGV arm mechanism 34' having upper and lower arms (transfer arms) 341C, 341D and an additional adapter (load port) 23'. The order and the timing of wafer transportation are denoted by the encircled numbers 1-10. In the embodiment of FIG. 20, the upper and lower arms 241A, 241B (encircled numbers 3, 6) of the prober arm mechanism 24 are used as the holding sites for shifting the timings of the deliveries of the wafers to/from the load ports 23, 23' (encircled numbers 2, 8; 5, 10) from each other.

Incidentally, the AGV (automated guided vehicle) as one embodiment of the automatic transporting device of the present invention includes an RGV (rail guided vehicle).

It is preferable that a storage medium for storing a program configured to execute the conveyance method of the present invention is utilized to control the conveyance system. For example, the storage medium is immovably mounted on the host computer 1. Alternatively, the storage medium may be removably mounted on a reader disposed on the host computer 1, and may be read by the reader. In the most typical case, the storage medium is a hard disk drive in which a control program has been installed by an operator of a manufacturing company of the conveyance system. In another case, the storage medium is a removable disk such as a CD-ROM or DVD-ROM in which a control program is written.

What is claimed is:

1. A conveyance method for transporting a plurality of unprocessed/processed objects between an automatic transporting device and a semiconductor manufacturing device, the manufacturing device having a single load port to/from which the objects are delivered from/to the automatic transporting device, a processing vessel, and a transporting mechanism for transferring the objects between the single load port and the processing vessel, said method comprising the steps of:

making a communication between the automatic transporting device and the manufacturing device to decide respective timings of deliveries of the objects to/from the single load port; and transporting the objects between the automatic transporting device and the manufacturing device via the single load port, with the timings of the deliveries of the objects to/from the single load port shifted from each other by using at least one of plural components of the automatic transporting device and the manufacturing device for provisionally holding the object, the at least one of plural components being selected from the group consisting of:

(a) a grinder-wafer table configured to place thereon a grinder wafer used for grinding a probe card provided in the processing vessel; and (b) an unloading table arranged below the single load port to provisionally place thereon the object, the unloading table and the single load port being configured to move integrally in a vertical direction.

2. A conveyance method as claimed in claim 1, wherein an optical communication is employed as the communication between the automatic transporting device and the manufacturing device.

3. A conveyance method as claimed in claim 1, wherein the semiconductor manufacturing device is an inspecting device configured to inspect the object by using the probe card.

4. A storage medium for storing a program configured to execute a conveyance method for transporting a plurality of unprocessed/processed objects between an automatic transporting device and a semiconductor manufacturing device, the manufacturing device having a single load port to/from which the objects are delivered from/to the automatic transporting device, a processing vessel, and a transporting mechanism for transferring the objects between the single load port and the processing vessel, said method comprising the steps of:

making a communication between the automatic transporting device and the manufacturing device to decide respective timings of deliveries of the objects to/from the single load port; and transporting the objects between the automatic transporting device and the manufacturing device via the single load port, with the timings of the deliveries of the objects to/from the single load port shifted from each other by using at least one of plural components of the automatic transporting device and the manufacturing device for provisionally holding the object, the at least one of plural components being selected from the group consisting of:

(a) a grinder-wafer table configured to place thereon a grinder wafer used for grinding a probe card provided in the processing vessel; and (b) an unloading table arranged below the single load port to provisionally place thereon the object, the unloading table and the single load port being configured to move integrally in a vertical direction.

* * * * *